(12) United States Patent
Takano et al.

(10) Patent No.: US 8,089,121 B2
(45) Date of Patent: Jan. 3, 2012

(54) NONVOLATILE SEMICONDUCTOR MEMORY DEVICE AND METHOD OF MANUFACTURING THE SAME

(75) Inventors: Kensuke Takano, Yokohama (JP);
Yoshio Ozawa, Yokohama (JP);
Katsuyuki Sekine, Yokohama (JP);
Masaru Kito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 256 days.

(21) Appl. No.: 12/564,605

(22) Filed: Sep. 22, 2009

(65) Prior Publication Data
US 2010/0123180 A1 May 20, 2010

(30) Foreign Application Priority Data
Nov. 17, 2008 (JP) ................................ 2008-293150

(51) Int. Cl.
*H01L 21/8246* (2006.01)
*H01L 27/115* (2006.01)
(52) U.S. Cl. ... 257/324; 257/314; 257/315; 257/E21.67; 257/E21.21; 438/257; 438/265
(58) Field of Classification Search .......... 257/314–324, 257/E21.67, E21.21; 438/257–265
See application file for complete search history.

(56) References Cited

U.S. PATENT DOCUMENTS

| 2007/0252201 A1 | 11/2007 | Kito et al. |
| 2009/0001352 A1* | 1/2009 | Han et al. ................. 257/24 |
| 2011/0092033 A1* | 4/2011 | Arai et al. ................ 438/152 |

FOREIGN PATENT DOCUMENTS

| JP | 2007-134720 | 5/2007 |
| JP | 2007-266143 | 10/2007 |

OTHER PUBLICATIONS

Yanli Pei, et al., "Memory Window Enhancement of MOS Memory Devices with High Density Self-Assembled Tungsten Nano-dot", Extended Abstracts of the 2007 International Conference on Solid State Devices and Materials, 2007, pp. 242-243.

* cited by examiner

*Primary Examiner* — Cuong Q Nguyen
*Assistant Examiner* — Cathy N Lam
(74) *Attorney, Agent, or Firm* — Oblon, Spivak, McClelland, Maier & Neustadt, L.L.P.

(57) ABSTRACT

A nonvolatile semiconductor memory device includes a semiconductor layer as a channel, a conductive layer which is formed on a surface of the semiconductor layer with a first insulating layer and a second insulating layer interposed therebetween and functions as a control gate electrode; and a plurality of first charge storage layers formed between the first insulating layer and the second insulating layer. The plurality of first charge storage layers are formed in isolation from one another along a surface of the first insulating layer. The first insulating layer is formed so as to protrude towards the semiconductor layer at a position where each of the first charge storage layers is formed.

8 Claims, 23 Drawing Sheets

NONVOLATILE SEMICONDUCTOR MEMORY DEVICE AND METHOD OF MANUFACTURING THE SAME

CROSS REFERENCE TO RELATED APPLICATIONS

This application is based upon and claims the benefit of priority from prior Japanese Patent Application No. 2008-293150, filed on Nov. 17, 2008, the entire contents of which are incorporated herein by reference.

BACKGROUND OF THE INVENTION

1. Field of the Invention

The present invention relates to an electrically rewritable nonvolatile semiconductor memory device and a method of manufacturing the same.

2. Description of the Related Art

Conventionally, there is developed a MONOS (Metal-Oxide-Nitride-Oxide-Silicon) memory element (for example, JP 2007-266143 A). This MONOS memory element stores data by storing a charge in a nitride film (Nitride).

In this kind of memory element, a greater degree of integration due to miniaturization is desired. However, when a high degree of integration is implemented, there is a risk that the charge stored in the nitride film moves between neighboring memory elements. In other words, there is a risk that a data holding characteristic deteriorates. In addition, a simplification of manufacturing steps is also desired along with the high degree of integration.

SUMMARY OF THE INVENTION

In accordance with a first aspect of the present invention, a nonvolatile semiconductor memory device includes: a semiconductor layer as a channel; a conductive layer which is formed on a surface of the semiconductor layer with a first insulating layer and a second insulating layer interposed therebetween and functions as a control gate electrode; and a plurality of first charge storage layers formed between the first insulating layer and the second insulating layer, the plurality of first charge storage layers being formed in isolation from one another along a surface of the first insulating layer, and the first insulating layer being formed so as to protrude towards the semiconductor layer at a position where each of the first charge storage layers is formed.

In accordance with a second aspect of the present invention, a nonvolatile semiconductor memory device includes a memory string which has a plurality of electrically rewritable memory cells connected in series, the memory string including: a semiconductor layer extending in a perpendicular direction with respect to a substrate; a conductive layer which is formed so as to surround a side surface of the semiconductor layer with a first insulating layer and a second insulating layer interposed therebetween and is configured to function as a control electrode of the memory cells; and a plurality of first charge storage layers formed between the first insulating layer and the second insulating layer, the plurality of first charge storage layers being formed in isolation from one another along a surface of the first insulating layer, and the first insulating layer being formed so as to protrude towards the semiconductor layer at a position where each of the first charge storage layers is formed.

In accordance with a third aspect of the present invention, a method of manufacturing a nonvolatile semiconductor memory device, the nonvolatile semiconductor memory device including a memory string having a plurality of electrically rewritable memory cells connected in series, includes: depositing a plurality of conductive layers; forming a hole so as to penetrate the plurality of conductive layers; forming a first insulating layer and a first charge storage layer in a side surface of the hole; applying a heat treatment to condense the first charge storage layer, thereby dividing the first charge storage layer into a plurality thereof; forming a second insulating layer on a surface of the first charge storage layer; and forming a semiconductor layer so as to fill the hole.

DETAILED DESCRIPTION OF THE EMBODIMENTS

Embodiments of a nonvolatile semiconductor memory device in accordance with the present invention are described below with reference to the drawings.

First Embodiment

Figure 1:
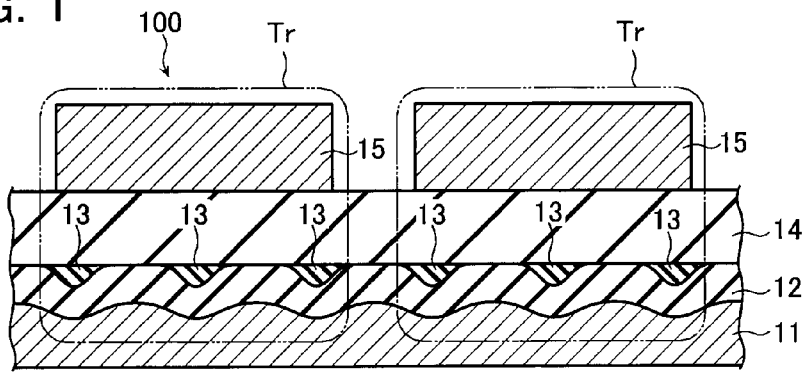
FIG. 1 is a schematic cross-sectional view of a nonvolatile semiconductor memory device 100 in accordance with a first embodiment of the present invention.

Configuration of a Nonvolatile Semiconductor Memory Device 100 in Accordance with a First Embodiment First, a configuration of a nonvolatile semiconductor memory device 100 in accordance with a first embodiment of the present invention is described with reference to FIG. 1. FIG. 1 is a schematic cross-sectional view of the nonvolatile semiconductor memory device 100 in accordance with the first embodiment of the present invention.

As shown in FIG. 1, the nonvolatile semiconductor memory device 100 in accordance with the first embodiment includes a plurality of memory transistors Tr connected in series.

The nonvolatile semiconductor memory device 100 includes a semiconductor substrate 11, and, formed sequentially on the semiconductor substrate 11, a tunnel insulating layer 12, a plurality of charge storage layers 13, a block insulating layer 14, and a plurality of conductive layers 15.

A surface of the semiconductor substrate 11 is formed in a wave shape having alternate concavity and convexity.

The tunnel insulating layer 12 is formed on the semiconductor substrate 11. The tunnel insulating layer 12 has a surface facing the semiconductor substrate 11 and formed in a wave shape having alternate concavity and convexity. The tunnel insulating layer 12 is formed so as to protrude toward the semiconductor substrate 11 at positions where the charge storage layers 13 are formed. Conversely, the semiconductor substrate 11 is formed to have concavity at the positions where the charge storage layers 13 are formed. A thickness of the tunnel insulating layer 12 is about 2 nm-8 nm.

The charge storage layers 13 are formed between the tunnel insulating layer 12 and the block insulating layer 14. The charge storage layers 13 are formed in isolation from one another along a surface of the tunnel insulating layer 12. The charge storage layers 13 are formed in a mountain shape protruding towards the semiconductor substrate 11. The charge storage layers 13 are formed along an entirety of the tunnel insulating layer 12 and the block insulating layer 14. A width and a thickness of the charge storage layers 13 is 0.5 nm or more. Moreover, a surface density of the charge storage layers 13 is about $1 \times 10^{10}$ cm$^{-2}$ or more.

The block insulating layer 14 is formed on an upper layer of the tunnel insulating layer 12 and the charge storage layers 13. A thickness of the block insulating layer 14 is about 5 nm or more.

The conductive layers 15 are formed on an upper surface of the block insulating layer 14. The conductive layers 15 are formed in stripes with a certain pitch.

The semiconductor substrate 11 and the conductive layers 15 are constituted by polysilicon (p-Si). The tunnel insulating layer 12 and the block insulating layer 14 are constituted by silicon oxide ($SiO_2$). The charge storage layers 13 are constituted by hafnium (Hf).

The above-described semiconductor substrate 11 functions as a channel of the memory transistors Tr. The conductive layers 15 function as a control gate electrode of the memory transistors Tr.

(Manufacturing Processes of the Nonvolatile Semiconductor Memory Device 100 in Accordance with the First Embodiment)

Next, manufacturing processes of the nonvolatile semiconductor memory device 100 in accordance with the first embodiment are described.

When silicon (Si) is used to form the charge storage layers 13, the silicon may be annealed at about 600° C.-700° C. Also, when hafnium (Hf) is used to form the charge storage layers 13, the hafnium may be annealed at about 500° C.-600° C. If another material is used to form the charge storage layers 13, the material may be annealed at an optimum temperature. The anneal atmosphere preferably does not include oxygen (for example a nitrogen atmosphere, or a hydrogen atmosphere) so that oxidation of the charge storage layers 13 may be avoided. For the above annealing, a sheet-feed type device or a batch-type device may be used. If the sheet-feed type device is used, the annealing time may be about one minute. If the batch-type device is used, the annealing time may be about one hour.

(Advantages of the Nonvolatile Semiconductor Memory Device 100 in Accordance with the First Embodiment)

Next, advantages of the nonvolatile semiconductor memory device 100 in accordance with the first embodiment are described below. In the nonvolatile semiconductor memory device 100 in accordance with the first embodiment, the tunnel insulating layer 12, the charge storage layers 13, and the block insulating layer 14 can each be formed in batch over a plurality of memory transistors Tr.

In addition, the nonvolatile semiconductor memory device 100 in accordance with the first embodiment has the charge storage layers 13 formed in isolation. Consequently, even in a case where the nonvolatile semiconductor memory device 100 in accordance with the first embodiment is miniaturized, movement of charge between the memory transistors Tr can be suppressed.

Furthermore, in the nonvolatile semiconductor memory device 100 in accordance with the first embodiment, a shape of the charge storage layers 13 causes the semiconductor substrate 11 to be configured in a concave shape. Consequently, during an erase operation in the nonvolatile semiconductor memory device 100 in accordance with the first embodiment, a strong electric field is applied locally from the charge storage layers 13 towards the semiconductor substrate 11. That is to say, an erase characteristic of the nonvolatile semiconductor memory device 100 in accordance with the first embodiment can be improved.

In addition, an effective cross-section area of the charge storage layers 13 along a vertical plane is larger than that of a second embodiment and a third embodiment (described below). Therefore, the charge storage layers 13 easily trap an electron, the first embodiment has a superior feature in the write characteristic.

Furthermore, a curvature of the charge storage layers 13 at the semiconductor substrate 11 side is smaller than that of a second embodiment and a third embodiment (described below). Therefore, when the charge storage layers 13 retain charges, an electric field applied to the semiconductor substrate 11 from the charge storage layers 13 is relatively small, and the first embodiment has a superior feature in the charge retention characteristics. That is, the shape of the charge storage layers 13 may be helpful for obtaining a semiconductor memory device having a high-reliability.

Second Embodiment

Figure 2:
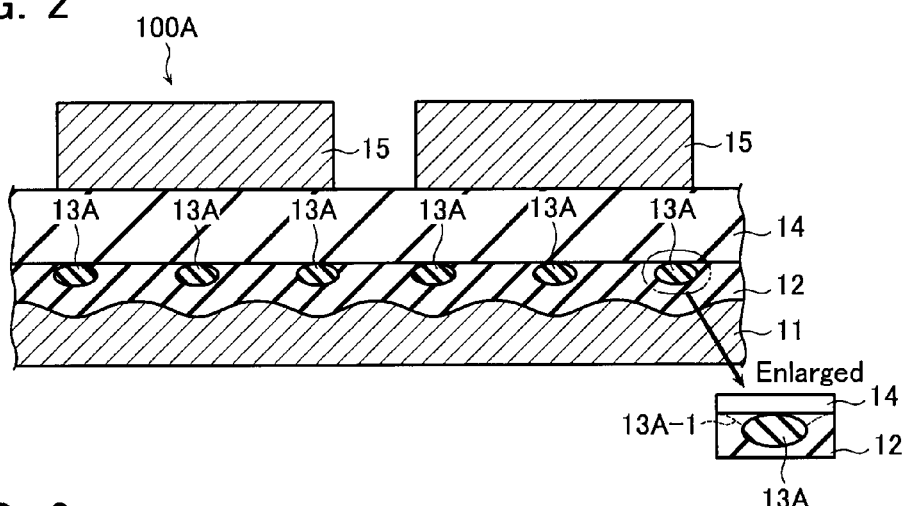
FIG. 2 is a schematic cross-sectional view of a nonvolatile semiconductor memory device 100A in accordance with a second embodiment of the present invention.

Configuration of a Nonvolatile Semiconductor Memory Device 100A in Accordance with a Second Embodiment Next, a configuration of a nonvolatile semiconductor memory device 100A in accordance with a second embodiment is described with reference to FIG. 2. FIG. 2 is a schematic cross-sectional view of the nonvolatile semiconductor memory device 100A in accordance with the second embodiment. Note that in the second embodiment, identical symbols are assigned to configurations similar to those in the first embodiment and descriptions thereof are omitted.

As shown in FIG. 2, the nonvolatile semiconductor memory device 100A in accordance with the second embodiment includes charge storage layers 13A of a shape that differs from those of the first embodiment. The charge storage layers 13A are formed in an elliptical shape.

(Manufacturing Processes of the Nonvolatile Semiconductor Memory Device 100A in Accordance with the Second Embodiment)

Next, manufacturing processes of the nonvolatile semiconductor memory device 100A in accordance with the second embodiment are described.

When silicon (Si) is used to form the charge storage layers 13A, the silicon may be annealed at about 700° C.-800° C. Also, when hafnium (Hf) is used to form the charge storage layers 13A, the hafnium may be annealed at about 600° C.-700° C. If another material is used to form the charge storage layers 13A, the material may be annealed at an optimum temperature. The other annealing conditions of the second embodiment are same as that of the first embodiment. Also, if the annealing temperature is set to a relatively high value within the above-mentioned temperature range (for example, Si: 750° C.-800° C., Hf: 650° C.-700° C.), a shoulder portion 13A-1 (Ref. FIG. 2) of the charge storage layer 13A that is in contact with an interface of the block insulating layer 14 is not formed. That is, the charge storage layer 13A can suppress movement of charges.

(Advantages of the Nonvolatile Semiconductor Memory Device 100 in Accordance with the Second Embodiment)

Next, advantages of the nonvolatile semiconductor memory device 100A in accordance with the second embodiment are described below.

The nonvolatile semiconductor memory device 100A in accordance with the second embodiment displays similar advantages to those of the first embodiment.

In addition, a curvature of the charge storage layers 13A at the semiconductor substrate 11 side is larger than that of the first embodiment. On erasing data, an electric field applied to the semiconductor substrate 11 from the charge storage layers 13A is relatively large as compared to that of the first embodiment. Therefore, the second embodiment has a superior feature in the erase characteristic. Also, the curvature is smaller than that of the third embodiment (described below), the second embodiment has a superior feature in the charge retention as compared to that of the third embodiment. That is, the shape of the charge storage layers 13A may be helpful for obtaining a device having both a high-speed operation and a high-reliability.

Third Embodiment

Figure 3:
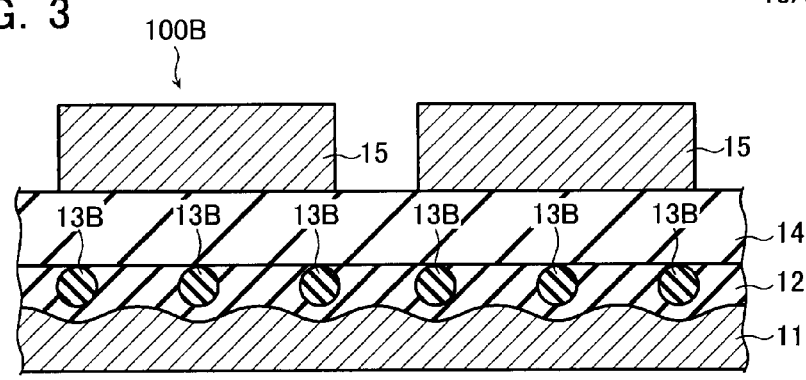
FIG. 3 is a schematic cross-sectional view of a nonvolatile semiconductor memory device 100B in accordance with a third embodiment of the present invention.

Configuration of a Nonvolatile Semiconductor Memory Device 100B in Accordance with a Third Embodiment Next, a configuration of a nonvolatile semiconductor memory device 100B in accordance with a third embodiment is described with reference to FIG. 3. FIG. 3 is a schematic cross-sectional view of the nonvolatile semiconductor memory device 100B in accordance with the third embodiment. Note that in the third embodiment, identical symbols are assigned to configurations similar to those in the first and second embodiments and descriptions thereof are omitted.

As shown in FIG. 3, the nonvolatile semiconductor memory device 100B in accordance with the third embodiment includes charge storage layers 13B of a shape that differs from those of the first and second embodiments. The charge storage layers 13B are formed in a spherical shape.

(Manufacturing Processes of the Nonvolatile Semiconductor Memory Device 100B in Accordance with the Third Embodiment)

Next, manufacturing processes of the nonvolatile semiconductor memory device 100B in accordance with the third embodiment are described.

When silicon (Si) is used to form the charge storage layers 13B, the silicon may be annealed above about 800° C. Also, when hafnium (Hf) is used to form the charge storage layers 13B, the hafnium may be annealed above about 700° C. If another material is used to form the charge storage layers 13B, the material may be annealed at an optimum temperature. The other annealing conditions of the third embodiment are same as that of the first embodiment and the second embodiment.

(Advantages of the Nonvolatile Semiconductor Memory Device 100B in Accordance with the Third Embodiment)

Next, advantages of the nonvolatile semiconductor memory device 100B in accordance with the third embodiment are described below.

The nonvolatile semiconductor memory device 100B in accordance with the third embodiment displays similar advantages to those of the first embodiment.

In addition, a curvature of the charge storage layers 13B at the semiconductor substrate 11 side is larger than that of the first and second embodiments. On erasing data, an electric field applied to the semiconductor substrate 11 from the charge storage layers 13B is relatively large as compared to that of the second embodiment. Therefore, the third embodiment has a more superior feature in the erase characteristic. That is, the shape of the charge storage layers 13B may be helpful for obtaining a device having a high-speed operation.

Fourth Embodiment

Figure 4:
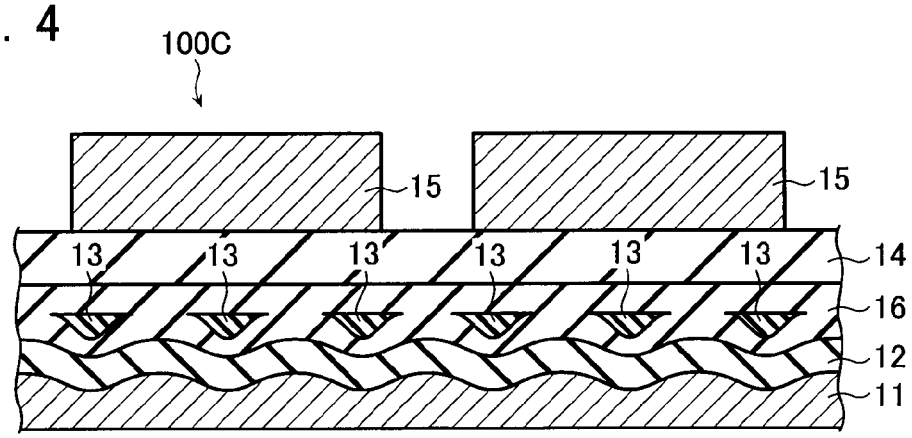
FIG. 4 is a schematic cross-sectional view of a nonvolatile semiconductor memory device 100C in accordance with a fourth embodiment of the present invention.

Configuration of a Nonvolatile Semiconductor Memory Device 100C in Accordance with a Fourth Embodiment Next, a configuration of a nonvolatile semiconductor memory device 100C in accordance with a fourth embodiment is described with reference to FIG. 4. FIG. 4 is a schematic cross-sectional view of the nonvolatile semiconductor memory device 100C in accordance with the fourth embodiment. Note that in the fourth embodiment, identical symbols are assigned to configurations similar to those in the first through third embodiments and descriptions thereof are omitted.

As shown in FIG. 4, the nonvolatile semiconductor memory device 100C in accordance with the fourth embodiment further includes a charge storage layer 16 in addition to the configurations in accordance with the first embodiment. The charge storage layer 16 is formed so as to surround the charge storage layers 13. An energy level for storing an electron in the charge storage layer 16 is shallower than an energy level for storing an electron in the charge storage layers 13. A thickness of the charge storage layer 16 is 2 nm or more.

(Advantages of the Nonvolatile Semiconductor Memory Device 100C in Accordance with the Fourth Embodiment)

Next, advantages of the nonvolatile semiconductor memory device 100C in accordance with the fourth embodiment are described below. As described above, the nonvolatile semiconductor memory device 100C in accordance with the fourth embodiment includes a charge storage layer 16 configured to surround the charge storage layers 13. Consequently, an electron trapped in the charge storage layer 16 can be easily moved to the charge storage layers 13 having a deeper level. This kind of configuration allows a write/erase characteristic of the nonvolatile semiconductor memory device 100C in accordance with the fourth embodiment to be improved over those of the first through third embodiments.

Fifth Embodiment

Figure 5:
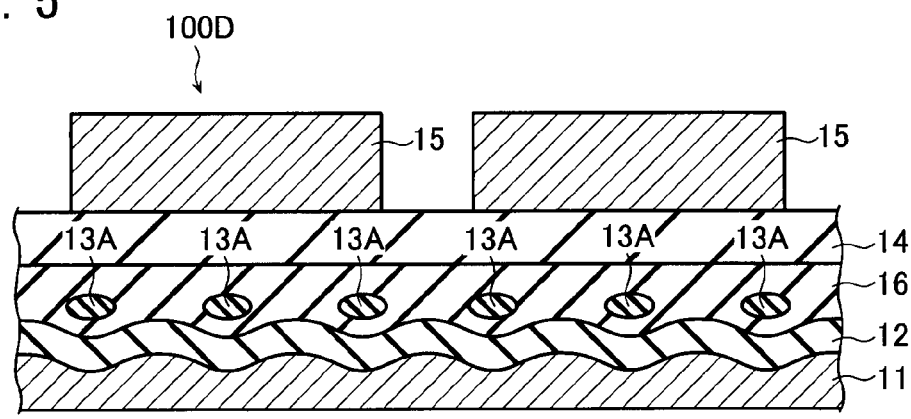
FIG. 5 is a schematic cross-sectional view of a nonvolatile semiconductor memory device 100D in accordance with a fifth embodiment of the present invention.

Next, a configuration of a nonvolatile semiconductor memory device 100D in accordance with a fifth embodiment is described with reference to FIG. 5. FIG. 5 is a schematic cross-sectional view of the nonvolatile semiconductor memory device 100D in accordance with the fifth embodiment. Note that in the fifth embodiment, identical symbols are assigned to configurations similar to those in the first through fourth embodiments and descriptions thereof are omitted.

As shown in FIG. 5, the nonvolatile semiconductor memory device 100D in accordance with the fifth embodiment differs from the fourth embodiment in including the charge storage layers 13A in place of the charge storage layers 13 of the fourth embodiment. The nonvolatile semiconductor memory device 100D in accordance with the fifth embodiment displays similar advantages to those of the second and fourth embodiment.

Sixth Embodiment

Figure 6:
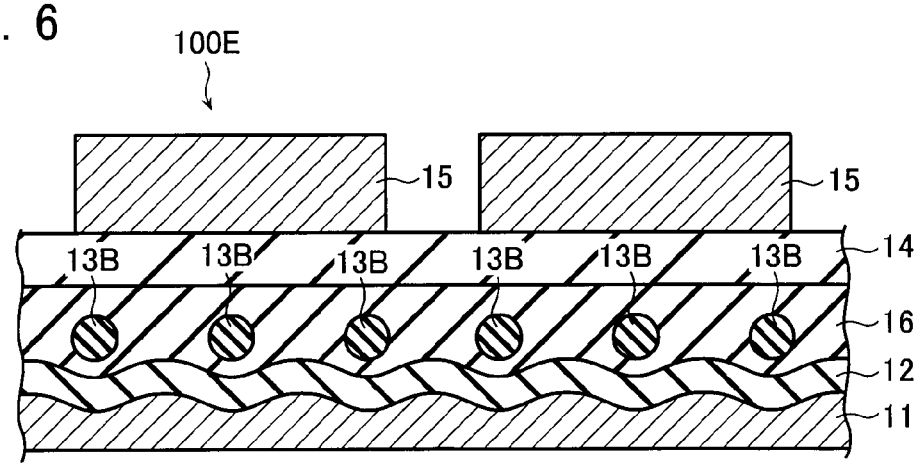
FIG. 6 is a schematic cross-sectional view of a nonvolatile semiconductor memory device 100E in accordance with a sixth embodiment of the present invention.

Next, a configuration of a nonvolatile semiconductor memory device 100E in accordance with a sixth embodiment is described with reference to FIG. 6. FIG. 6 is a schematic cross-sectional view of the nonvolatile semiconductor memory device 100E in accordance with the sixth embodiment. Note that in the sixth embodiment, identical symbols are assigned to configurations similar to those in the first through fifth embodiments and descriptions thereof are omitted.

As shown in FIG. 6, the nonvolatile semiconductor memory device 100E in accordance with the sixth embodiment differs from the fourth and fifth embodiments in including the charge storage layers 13B in place of the charge storage layers 13 and 13A of the fourth and fifth embodiments. The nonvolatile semiconductor memory device 100E in accordance with the sixth embodiment displays similar advantages to those of the third and fourth embodiment.

Seventh Embodiment

Figure 7:
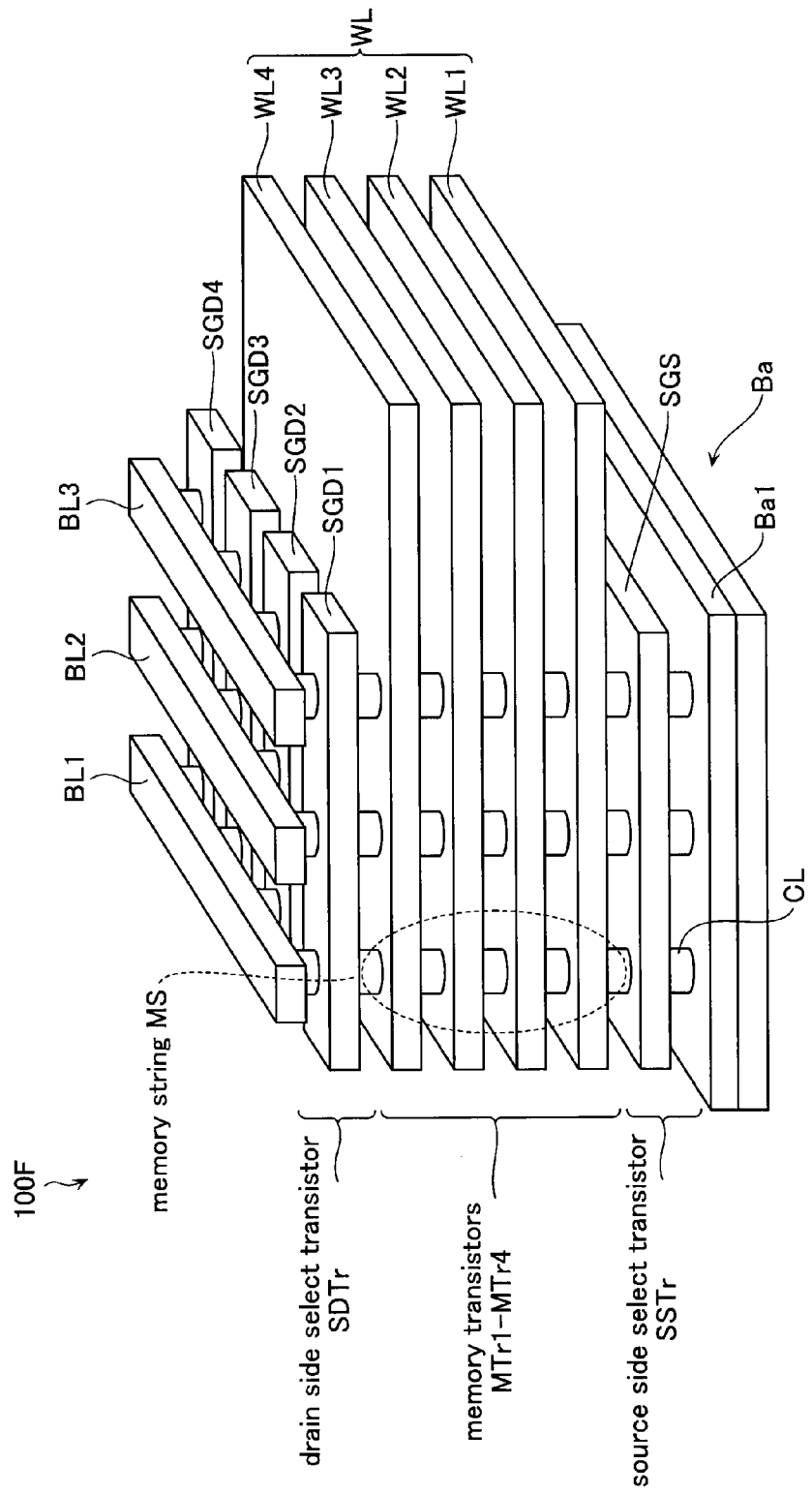
FIG. 7 shows a schematic view of a nonvolatile semiconductor memory device 100F in accordance with a seventh embodiment of the present invention.

Configuration of a Nonvolatile Semiconductor Memory Device 100F in Accordance with a Seventh Embodiment Next, a configuration of a nonvolatile semiconductor memory device 100F in accordance with a seventh embodiment is described with reference to FIG. 7. FIG. 7 shows a schematic view of the nonvolatile semiconductor memory device 100F in accordance with the seventh embodiment of the present invention. As shown in FIG. 7, the nonvolatile semiconductor memory device 100F in accordance with the seventh embodiment is formed by stacking a plurality of semiconductor layers. Further as shown in FIG. 7, word lines WL of each layer are formed so as to extend two-dimensionally in a horizontal direction. The word lines WL of each layer are respectively configured to have a plate-like plane surface structure formed from an identical layer.

In the seventh embodiment, the nonvolatile semiconductor memory device 100F includes 3×4 memory strings MS, each of the memory strings MS configured from memory transistors MTr1-MTr4 and having connected to one end thereof a source-side select transistor SSTr and to another end thereof a drain-side select transistor SDTr.

Word lines WL1-WL4 are connected to gates of the memory transistors MTr1-MTr4 in each of the memory strings MS, respectively. Each of the word lines WL1-WL4 is connected in common to the gates of the memory transistors MTr1-MTr4 on the same layer. The word lines WL1-WL4 are formed of the same conductive film. That is to say, the gates of the memory transistor MTr1 of each of the memory strings MS are all connected to the word line WL1; the gates of the memory transistor MTr2 of each of the memory strings MS are all connected to the word line WL2; the gates of the memory transistor MTr3 of each of the memory strings MS are all connected to the word line WL3; and the gates of the memory transistor MTr4 of each of the memory strings MS are all connected to the word line WL4. As shown in FIG. 7, in the nonvolatile semiconductor memory device 100F in accordance with the seventh embodiment, the word lines WL1-WL4 are each formed so as to extend two-dimensionally in a horizontal direction parallel to a semiconductor substrate Ba. In addition, the word lines WL1-WL4 are each disposed substantially perpendicular to the memory strings MS. Furthermore, the word lines WL1-WL4 have an end thereof in a row direction formed in a stepped shape. Here, the row direction is a direction orthogonal to a stacking direction, and a column direction is a direction orthogonal to the stacking direction and the row direction.

Included in each of the memory strings MS on an n+ region formed in a p-well region Ba1 of the semiconductor substrate Ba is a column-shaped columnar semiconductor CL. Each of the columnar semiconductors CL is formed on the semiconductor substrate Ba along the stacking direction, and is disposed so as to configure a matrix on surfaces of the semiconductor substrate Ba and the word lines WL1-WL4. In other words, the memory strings MS are also disposed in a matrix formation on surfaces perpendicular to the columnar semiconductors CL. Note that the columnar semiconductor CL may have a cylindrical column shape or a prismatic column shape. Moreover, the columnar semiconductor CL may be a column-shaped semiconductor having a tiered shape.

Further as shown in FIG. 7, rectangular plate-like drain-side select gate lines SGD (shown in FIG. 7 as SGD1-SGD4) that configure the drain-side select transistor SDTr are provided above the memory string MS in contact with the columnar semiconductor CL with an insulating film (not shown) interposed therebetween. The drain-side select gate lines SGD are each separated and insulated one from another and, unlike the word lines WL1-WL4, are formed in lines provided extending in the row direction and repeating in the column direction. Moreover, the columnar semiconductor CL is provided penetrating a center in the column direction of the drain-side select gate lines SGD.

Further as shown in FIG. 7, a source-side select gate line SGS that configures the source-side select transistor SSTr is provided below the memory string MS in contact with the columnar semiconductor CL with an insulating film (not shown) interposed therebetween. The source-side select gate line SGS is formed so as to extend two-dimensionally in the horizontal direction, similarly to the word lines WL1-WL4. Note that, in addition to a structure shown in FIG. 7, the source-side select gate line SGS may also be shaped in rectangular strips provided extending in the row direction and repeating in the column direction.

Figure 8:
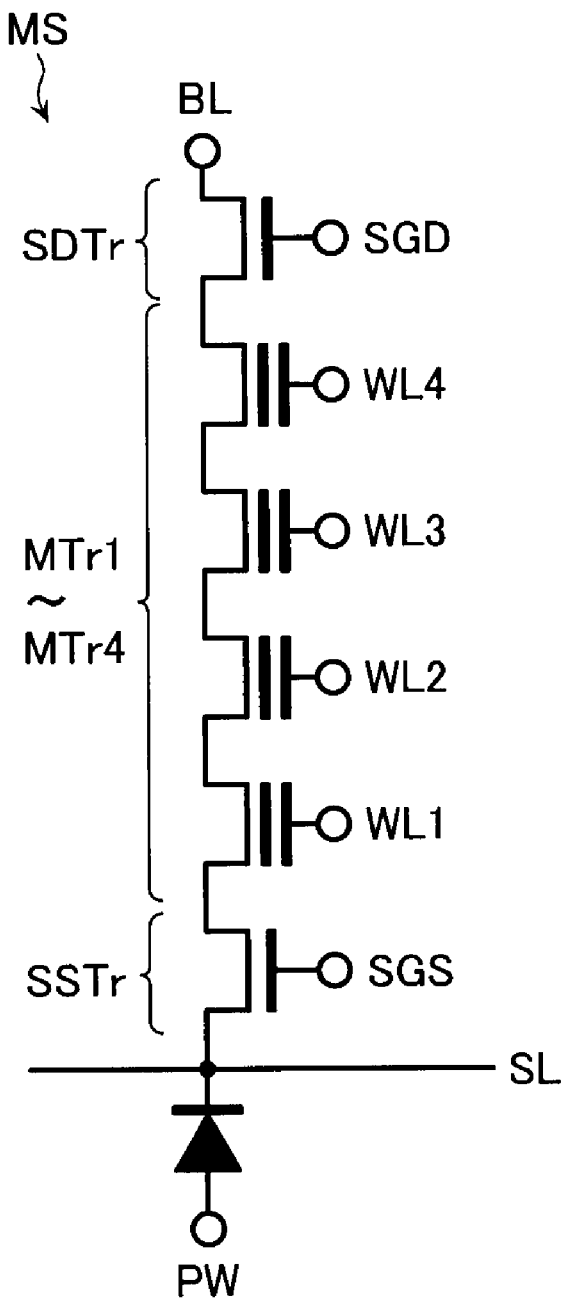
FIG. 8 is a circuit diagram of one memory string MS in the seventh embodiment.

Next, a configuration and operation of a circuit constituted by the memory string MS in the seventh embodiment is described with reference to FIGS. 7 and 8. FIG. 8 is a circuit diagram of one memory string MS in the seventh embodiment.

As shown in FIGS. 7 and 8, in the seventh embodiment, the memory string MS is configured by four memory transistors MTr1-MTr4 connected in series. Connected to one end of the memory string MS is the source-side select transistor SSTr. Connected to another end of the memory string MS is the drain-side select transistor SDTr. In the memory string MS, the columnar semiconductor CL is formed on the n+ region formed in a p-type region (the p-well region) Ba1 on the semiconductor substrate Ba.

A source of the source-side select transistor SSTr is connected to a source line SL (the n+ region formed in the p-well region Ba1 of the semiconductor substrate Ba). A drain of the drain-side select transistors SDTr is connected to a bit line BL.

Each of the memory transistors MTr includes the columnar semiconductor CL, the charge storage layer formed so as to surround the columnar semiconductor CL, and the word line WL formed so as to surround the charge storage layer. The word line WL functions as a control gate electrode of the memory transistor MTr.

In the nonvolatile semiconductor memory device 100F having the above-described configuration, read, write and erase of data is executed by controlling a charge in the charge storage layer of a certain memory transistor MTr.

(Specific Configuration of the Nonvolatile Semiconductor Memory Device 100F in Accordance with the Seventh Embodiment)

Figure 9:
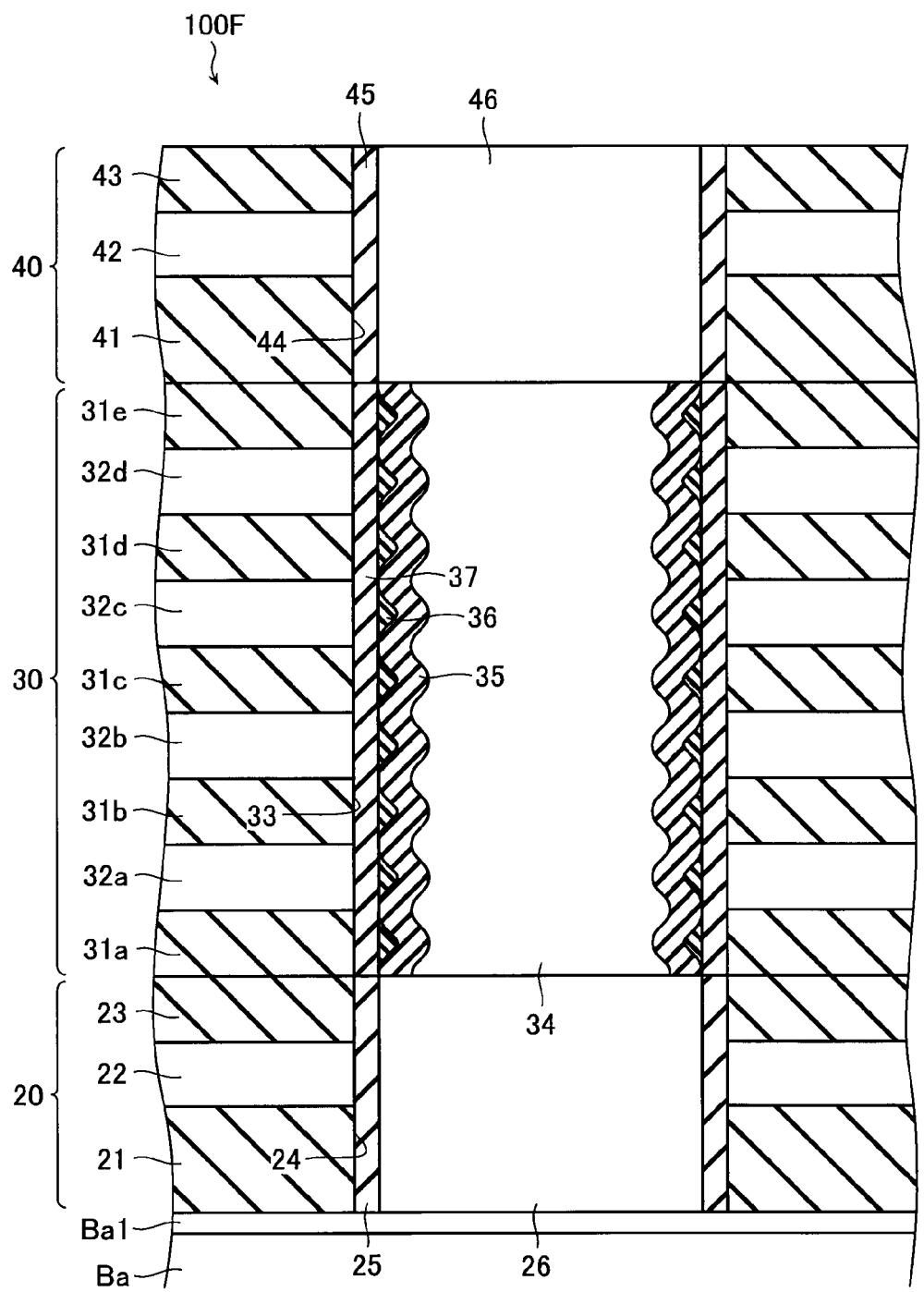
FIG. 9 is a cross-sectional view of the nonvolatile semiconductor memory device 100F in the seventh embodiment.

Next, a more specific configuration of the nonvolatile semiconductor memory device 100F is described with reference to FIG. 9. FIG. 9 is a cross-sectional view of the nonvolatile semiconductor memory device 100F in the seventh embodiment. As shown in FIG. 9, the nonvolatile semiconductor memory device 100F includes, from a lower layer to an upper layer on the semiconductor substrate Ba, a source-side select transistor layer 20, a memory transistor layer 30, and a drain-side select transistor layer 40. The source-side select transistor layer 20 functions as the source-side select transistor SSTr. The memory transistor layer 30 functions as the memory transistors MTr1-MTr4 (the memory string MS). The drain-side select transistor layer 40 functions as the drain-side select transistor SDTr.

The p-type region (p-well region) Ba1 is formed on the semiconductor substrate Ba. The n+ region (a source line region) is formed on the p-type region Ba1.

The source-side select transistor layer 20 includes a source-side first insulating layer 21, a source-side conductive layer 22, and a source-side second insulating layer 23 stacked sequentially on the semiconductor substrate Ba.

The source-side first insulating layer 21, the source-side conductive layer 22, and the source-side second insulating layer 23 are formed so as to extend two-dimensionally in the horizontal direction parallel to the semiconductor substrate Ba. The source-side first insulating layer 21, the source-side conductive layer 22, and the source-side second insulating layer 23 are grouped into certain regions (erase units).

The source-side first insulating layer 21 and the source-side second insulating layer 23 are constituted by silicon oxide ($SiO_2$). The source-side conductive layer 22 is constituted by polysilicon (p-Si).

In addition, the source-side select transistor layer 20 includes a source-side hole 24. The source-side hole 24 is formed so as to penetrate the source-side second insulating layer 23, the source-side conductive layer 22, and the source-side first insulating layer 21. The source-side hole 24 is formed in a matrix.

The source-side select transistor layer 20 also includes a source-side gate insulating layer 25 and a source-side columnar semiconductor layer 26. The source-side gate insulating layer 25 is formed on a side wall of the source-side hole 24. The source-side columnar semiconductor layer 26 is formed in contact with the source-side gate insulating layer 25 so as to fill the source-side hole 24.

The source-side gate insulating layer 25 is constituted by silicon oxide ($SiO_2$). The source-side columnar semiconductor layer 26 is constituted by polysilicon (p-Si).

Note that to rephrase a configuration of the source-side conductive layer 22 in the above-described configuration of the source-side select transistor layer 20, the source-side conductive layer 22 is formed so as to sandwich the source-side gate insulating layer 25 between itself and the source-side columnar semiconductor layer 26.

Moreover, in the source-side select transistor layer 20, the source-side conductive layer 22 functions as the source-side select gate line SGS; and the source-side conductive layer 22 functions as a control gate of the source-side select transistor SSTr.

The memory transistor layer 30 includes first through fifth inter-word line insulating layers 31a-31e, and first through fourth word line conductive layers 32a-32d provided between the first through fifth inter-word line insulating layers 31a-31e upward and downward thereof, the layers 31a-31e and 32a-32d being provided on an upper layer of the source-side select transistor layer 20.

The first through fifth inter-word line insulating layers 31a-31e and the first through fourth word line conductive layers 32a-32d are formed so as to extend two-dimensionally in the row direction and the column direction. The first through fifth inter-word line insulating layers 31a-31e and the first through fourth word line conductive layers 32a-32d are grouped into the certain regions (erase units) and have an end thereof in a row direction formed in a stepped shape.

The first through fifth inter-word line insulating layers 31a-31e are constituted by silicon oxide ($SiO_2$). The first through fourth word line conductive layers 32a-32d are constituted by polysilicon (p-Si).

In addition, the memory transistor layer 30 includes a memory hole 33.

The memory hole 33 is formed so as to penetrate the first through fifth inter-word line insulating layers 31a-31e and the first through fourth word line conductive layers 32a-32d. The memory hole 33 is provided at a position aligning with the source-side hole 24.

The memory transistor layer 30 further includes a memory columnar semiconductor layer 34, a tunnel insulating layer 35, a plurality of charge storage layers 36, and a block insulating layer 37.

The memory columnar semiconductor layer 34 is formed in the memory hole 33 so as to extend in the perpendicular direction with respect to the semiconductor substrate Ba. That is to say, the memory columnar semiconductor layer 34 is formed so as to penetrate the first through fourth word line conductive layers 32a-32d. A surface of the memory columnar semiconductor layer 34 is formed in a wave shape having alternate concavity and convexity. The memory columnar semiconductor layer 34 is formed so as to be in contact with an upper surface of the source-side columnar semiconductor layer 26 and a lower surface of a drain-side columnar semiconductor layer 46 to be described hereafter.

The tunnel insulating layer 35 is formed in the memory hole 33 on a side surface of the memory columnar semiconductor layer 34. The tunnel insulating layer 35 has a surface facing the memory columnar semiconductor layer 34 and formed in a wave shape having alternate concavity and convexity. The tunnel insulating layer 35 is formed so as to protrude towards the memory columnar semiconductor layer 34 at positions where the charge storage layers 36 are formed. Conversely, the memory columnar semiconductor layer 34 is formed to be have concavity at the positions where the charge storage layers 36 are formed. The tunnel insulating layer 35 has a thickness of about 2 nm-8 nm.

The charge storage layers 36 are formed between the tunnel insulating layer 35 and the block insulating layer 37. The charge storage layers 36 are formed in isolation from one another along a surface of the tunnel insulating layer 35. The charge storage layers 36 are formed in a mountain shape protruding towards the memory columnar semiconductor layer 34. The charge storage layers 36 are formed at a position of the first through fifth inter-word line insulating layers 31a-31e in the stacking direction and at a position of the first through fourth word line conductive layers 32a-32d in the stacking direction. A width and a thickness of the charge storage layers 36 is 0.5 nm or more. Moreover, a surface density of the charge storage layers 36 is about $1\times10^{10}$ cm$^{-2}$ or more.

The block insulating layer 37 is formed on a side surface of the tunnel insulating layer 35 and the charge storage layers 36. The block insulating layer 37 has a thickness of about 5 nm or more.

Note that to rephrase the above-described configuration, the first through fourth word line conductive layers 32a-32d are formed so as to surround a side surface of the memory columnar semiconductor layer 34, with the block insulating layer 37, the charge storage layers 36, and the tunnel insulating layer 35 interposed therebetween.

The memory columnar semiconductor layer 34 is constituted by polysilicon (p-Si). The tunnel insulating layer 35 and the block insulating layer 37 are constituted by silicon oxide ($SiO_2$). The charge storage layers 36 are constituted by hafnium (Hf).

In the above-described memory transistor layer 30, the first through fourth word line conductive layers 32a-32d function as the word lines WL1-WL4; and the first through fourth word line conductive layers 32a-32d function as a control gate of the memory transistors MTr1-MTr4.

The drain-side select transistor layer 40 includes a drain-side first insulating layer 41, a drain-side conductive layer 42, and a drain-side second insulating layer 43 stacked sequentially on an upper surface of the memory transistor layer 30.

The drain-side first insulating layer 41, the drain-side conductive layer 42, and the drain-side second insulating layer 43 are provided at a position aligning with an upper portion of the memory columnar semiconductor layer 34 and are formed in stripes provided extending in the row direction and repeating in the column direction.

The drain-side first insulating layer 41 and the drain-side second insulating layer 43 are constituted by silicon oxide ($SiO_2$). The drain-side conductive layer 42 is constituted by polysilicon (p-Si).

In addition, the drain-side select transistor layer 40 includes a drain-side hole 44.

The drain-side hole 44 is formed so as to penetrate the drain-side second insulating layer 43, the drain-side conductive layer 42, and the drain-side first insulating layer 41. The drain-side hole 44 is formed at a position aligning with the memory hole 33.

The drain-side select transistor layer 40 also includes a drain-side gate insulating layer 45 and a drain-side columnar semiconductor layer 46.

The drain-side gate insulating layer 45 is formed on a side wall of the drain-side hole 44. The drain-side columnar semiconductor layer 46 is formed in contact with the drain-side gate insulating layer 45 so as to fill the drain-side hole 44.

The drain-side gate insulating layer 45 is constituted by silicon oxide ($SiO_2$). The drain-side columnar semiconductor layer 46 is constituted by polysilicon (p-Si).

Note that to rephrase a configuration of the drain-side conductive layer 42 in the above-described configuration of the drain-side select transistor layer 40, the drain-side conductive layer 42 is formed so as to sandwich the drain-side gate insulating layer 45 between itself and the drain-side columnar semiconductor layer 46.

Moreover, in the drain-side select transistor layer 40, the drain-side conductive layer 42 functions as the drain-side select gate line SGD; and the drain-side conductive layer 42 functions as a control gate of the drain-side select transistor SDTr.

(Manufacturing Processes of the Nonvolatile Semiconductor Memory Device 100F in Accordance with the Seventh Embodiment)

Next, manufacturing processes of the nonvolatile semiconductor memory device 100F in accordance with the seventh embodiment are described with reference to FIGS. 10-13. FIGS. 10-13 are cross-sectional views showing a manufacturing process of the nonvolatile semiconductor memory device 100F in accordance with the seventh embodiment.

Figure 10:
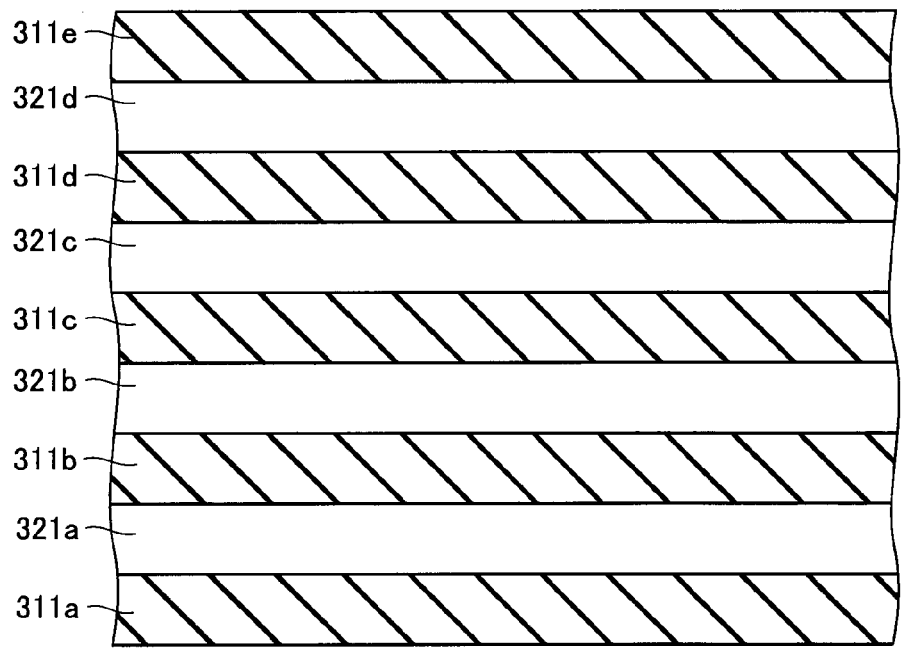
FIG. 10 is a cross-sectional view showing a manufacturing process of the nonvolatile semiconductor memory device 100F in accordance with the seventh embodiment.

First, subsequent to forming the source-side select transistor layer 20, silicon oxide ($SiO_2$) and polysilicon (p-Si) are alternately deposited to form layers 311a-311e and layers 321a-321d, as shown in FIG. 10. The layers 311a-311e later become the first through fifth inter-word line insulating layers 31a-31e. The layers 321a-321d later become the first through fourth word line conductive layers 32a-32d.

Figure 11:
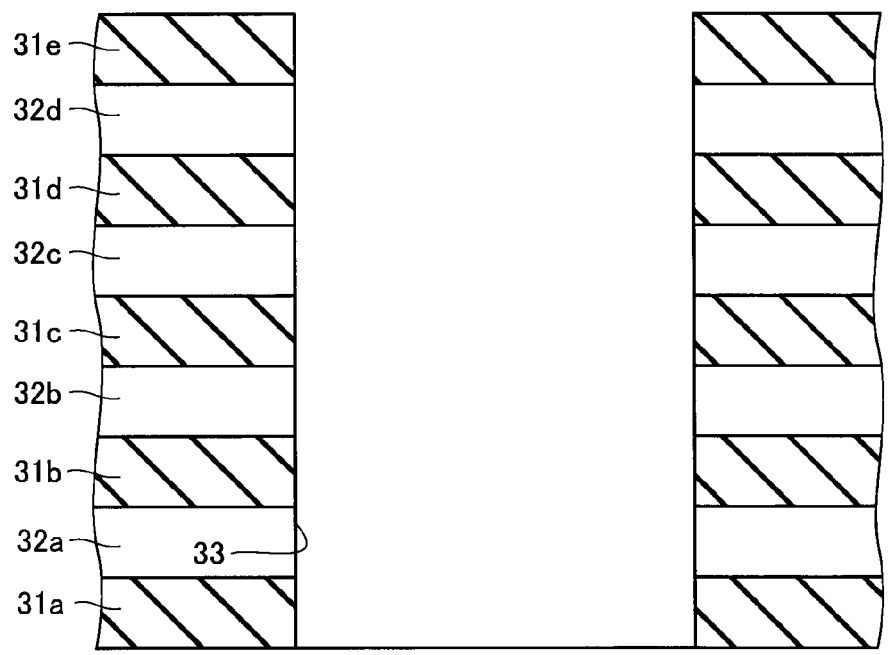
FIG. 11 is a cross-sectional view showing a manufacturing process of the nonvolatile semiconductor memory device 100F in accordance with the seventh embodiment.

Then, as shown in FIG. 11, the memory hole 33 is formed using dry etching at a position aligning with the source-side hole 24 so as to penetrate the layers 311a-311e and the layers 321a-321d. Through this process, the layers 311a-311e become the first through fifth inter-word line insulating layers 31a-31e; and the layers 321a-321d become the first through fourth word line conductive layers 32a-32d.

Figure 12:
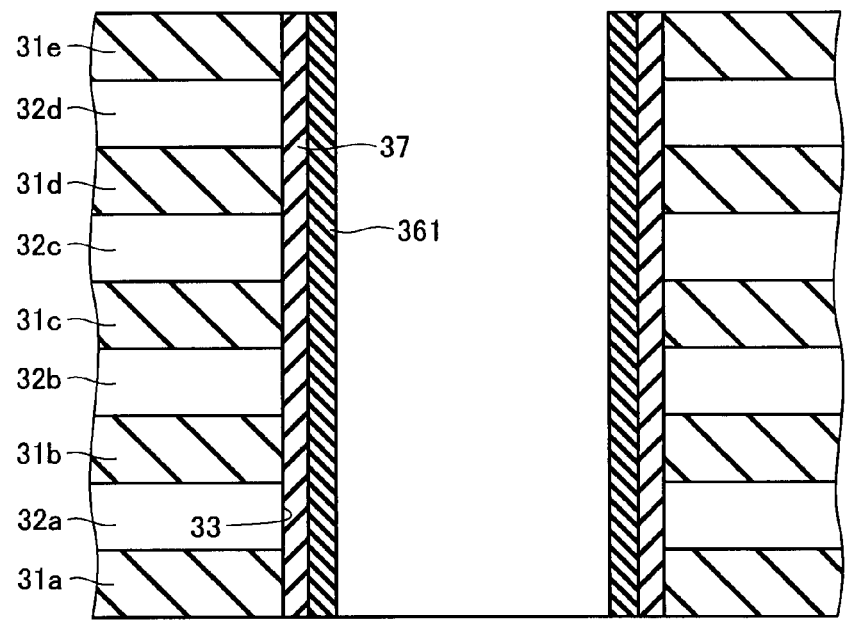
FIG. 12 is a cross-sectional view showing a manufacturing process of the nonvolatile semiconductor memory device 100F in accordance with the seventh embodiment.

Next, as shown in FIG. 12, silicon oxide ($SiO_2$) and hafnium (Hf) are sequentially deposited on a side surface of the memory hole 33 to form the block insulating layer 37 and a layer 361. The layer 361 is a layer that later becomes the charge storage layers 36. Here, the block insulating layer 37 is formed at a high temperature of 600° C.-800° C., utilizing LPCVD using dichlorosilane and nitrous oxide. Or, the block insulating layer 37 is formed utilizing ALD in a temperature band of 400° C.-600° C. with 3DMAS, BTBAS and ozone as materials. The layer 361 is formed utilizing ALD at 200° C.-400° C. Organic sources such as TEMAH, TDEAH, and HTB are used as raw material for the hafnium (Hf) that is to become the layer 361.

Figure 13:
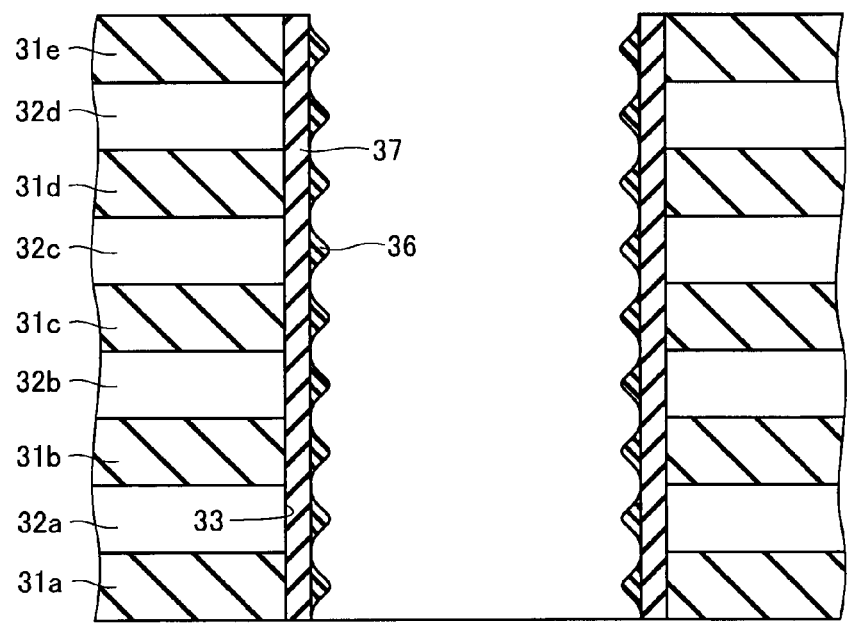
FIG. 13 is a cross-sectional view showing a manufacturing process of the nonvolatile semiconductor memory device 100F in accordance with the seventh embodiment.

Subsequently, as shown in FIG. 13, a heat treatment (annealing) is applied to condense the layer 361, thereby dividing (discretizing) the layer 361 into a plurality thereof. Through this process, the layer 361 becomes the charge storage layers 36. The heat treatment is set at 500° C. or more. Note that a shape of the charge storage layers 36 can be controlled by changing conditions of the heat treatment.

Following FIG. 13, silicon oxide ($SiO_2$) is deposited on a surface of the charge storage layers 36 to form the tunnel insulating layer 35. Note that the tunnel insulating layer 35 is formed by a similar method to that used in forming the block insulating layer 37.

Next, polysilicon (p-Si) is deposited in contact with the tunnel insulating layer 35 so as to fill the memory hole 33, thereby forming the memory columnar semiconductor layer 34. Then, the drain-side select transistor layer 40 is formed, thereby forming the nonvolatile semiconductor memory device 100F in accordance with the seventh embodiment shown in FIG. 9.

(Advantages of the Nonvolatile Semiconductor Memory Device 100F in Accordance with the Seventh Embodiment)

Next, advantages of the nonvolatile semiconductor memory device 100F in accordance with the seventh embodiment are described below. The nonvolatile semiconductor memory device 100F in accordance with the seventh embodiment is capable of a high degree of integration as shown in the above-described stacking structure. Moreover, in the nonvolatile semiconductor memory device 100F, each of the layers that become the memory transistors MTr and each of the layers that become the source-side select transistor SSTr and the drain-side select transistor SDTr can be manufactured in a certain number of lithography processes irrespective of a number of stacking layers, as described in the aforementioned manufacturing processes. That is to say, the nonvolatile semiconductor memory device 100F can be manufactured at a low cost.

In addition, the nonvolatile semiconductor memory device 100F in accordance with the seventh embodiment includes the charge storage layers 36 and the tunnel insulating layer 35 having a similar configuration to those of the first embodiment. Consequently, the nonvolatile semiconductor memory device 100F in accordance with the seventh embodiment displays similar advantages to those of the first embodiment.

Eighth Embodiment

Figure 14:
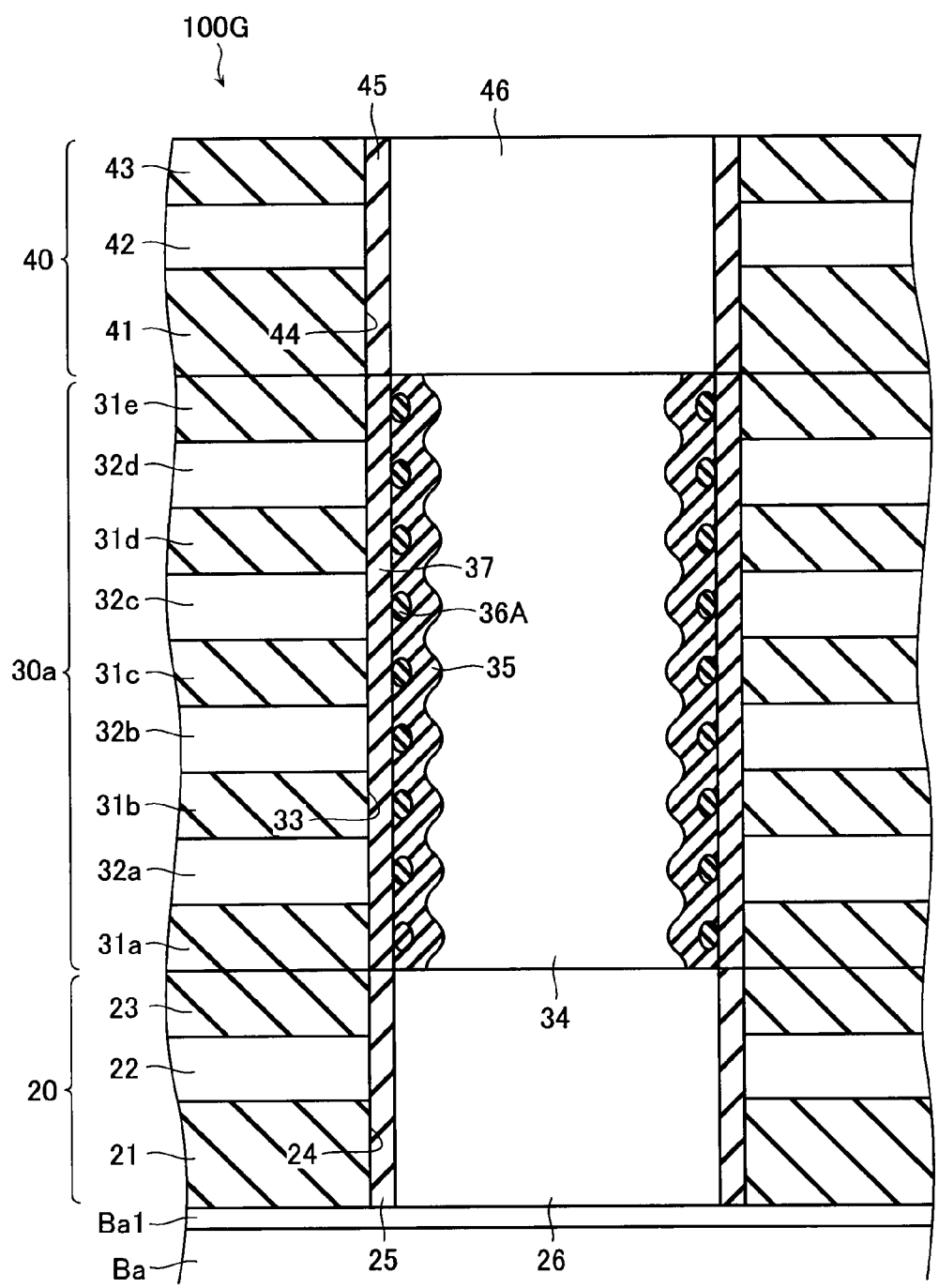
FIG. 14 is a cross-sectional view of a nonvolatile semiconductor memory device 100G in accordance with an eighth embodiment.

Next, a configuration of a nonvolatile semiconductor memory device 100G in accordance with an eighth embodiment is described with reference to FIG. 14. FIG. 14 is a schematic cross-sectional view of the nonvolatile semiconductor memory device 100G in accordance with the eighth embodiment. Note that in the eighth embodiment, identical symbols are assigned to configurations similar to those in the first through seventh embodiments and descriptions thereof are omitted.

As shown in FIG. 14, the nonvolatile semiconductor memory device 100G in accordance with the eighth embodiment includes a memory transistor layer 30a which differs from that of the seventh embodiment.

The memory transistor layer 30a includes charge storage layers 36A of a different shape to those of the seventh embodiment. The charge storage layers 36A are formed in an elliptical shape. The charge storage layers 36A can be formed by setting a temperature of annealing of the layer 361 higher and a time of annealing of the layer 361 longer than in the seventh embodiment. The nonvolatile semiconductor memory device 100G in accordance with the eighth embodiment displays similar advantages to those of the second and seventh embodiment.

Ninth Embodiment

Figure 15:
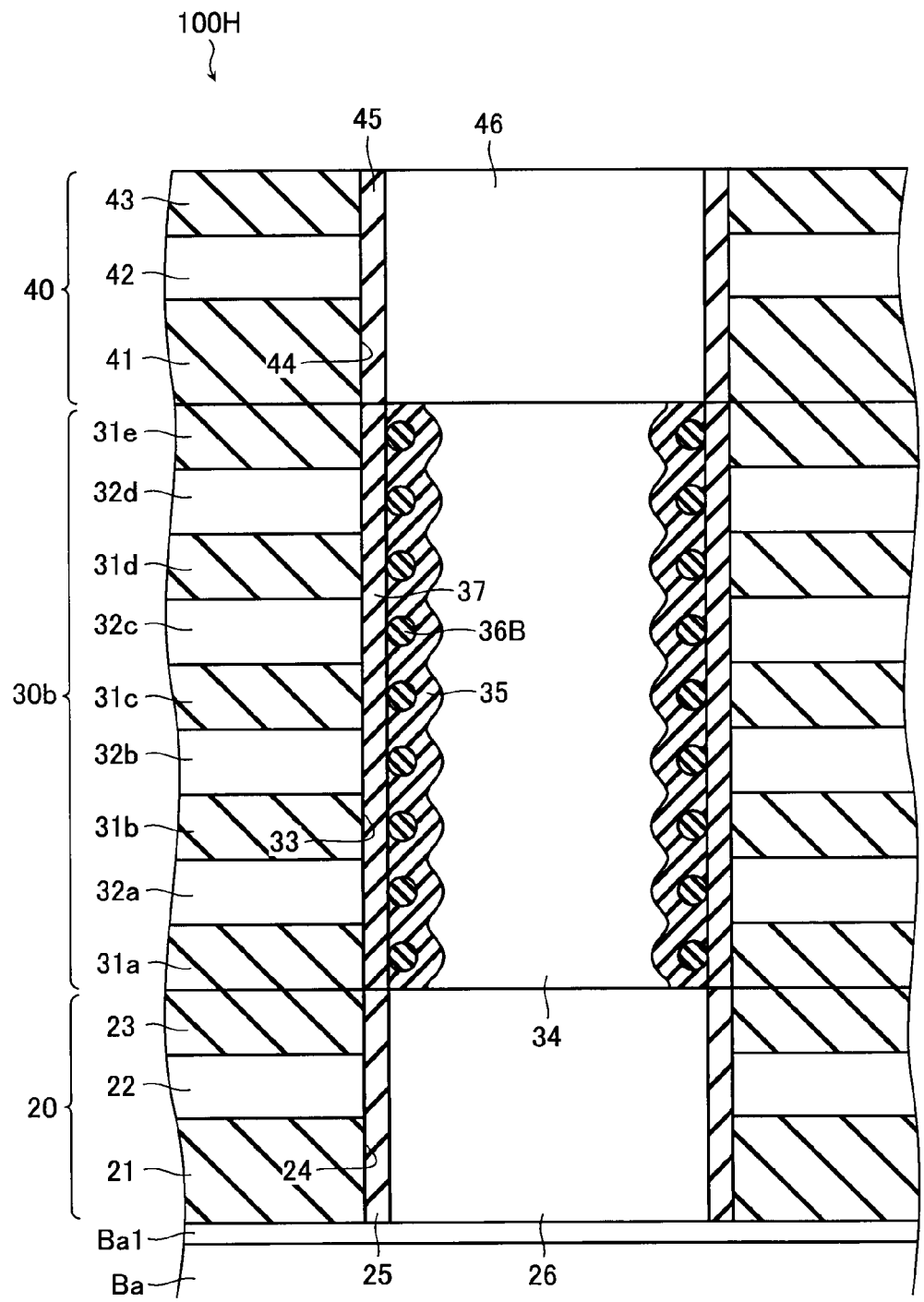
FIG. 15 is a cross-sectional view of a nonvolatile semiconductor memory device 100H in accordance with a ninth embodiment.

Next, a configuration of a nonvolatile semiconductor memory device 100H in accordance with a ninth embodiment is described with reference to FIG. 15. FIG. 15 is a schematic cross-sectional view of the nonvolatile semiconductor memory device 100H in accordance with the ninth embodiment. Note that in the ninth embodiment, identical symbols are assigned to configurations similar to those in the first through eighth embodiments and descriptions thereof are omitted.

As shown in FIG. 15, the nonvolatile semiconductor memory device 100H in accordance with the ninth embodiment includes a memory transistor layer 30b which differs from those of the seventh and eighth embodiments.

The memory transistor layer 30b includes charge storage layers 36B of a different shape to those of the seventh and eighth embodiments. The charge storage layers 36B are formed in a spherical shape. The charge storage layers 36B can be formed by setting a temperature of annealing of the layer 361 higher and a time of annealing of the layer 361 longer than in the seventh and eighth embodiments. The nonvolatile semiconductor memory device 100H in accordance with the ninth embodiment displays similar advantages to those of the third and seventh embodiment.

Tenth Embodiment

Figure 16:
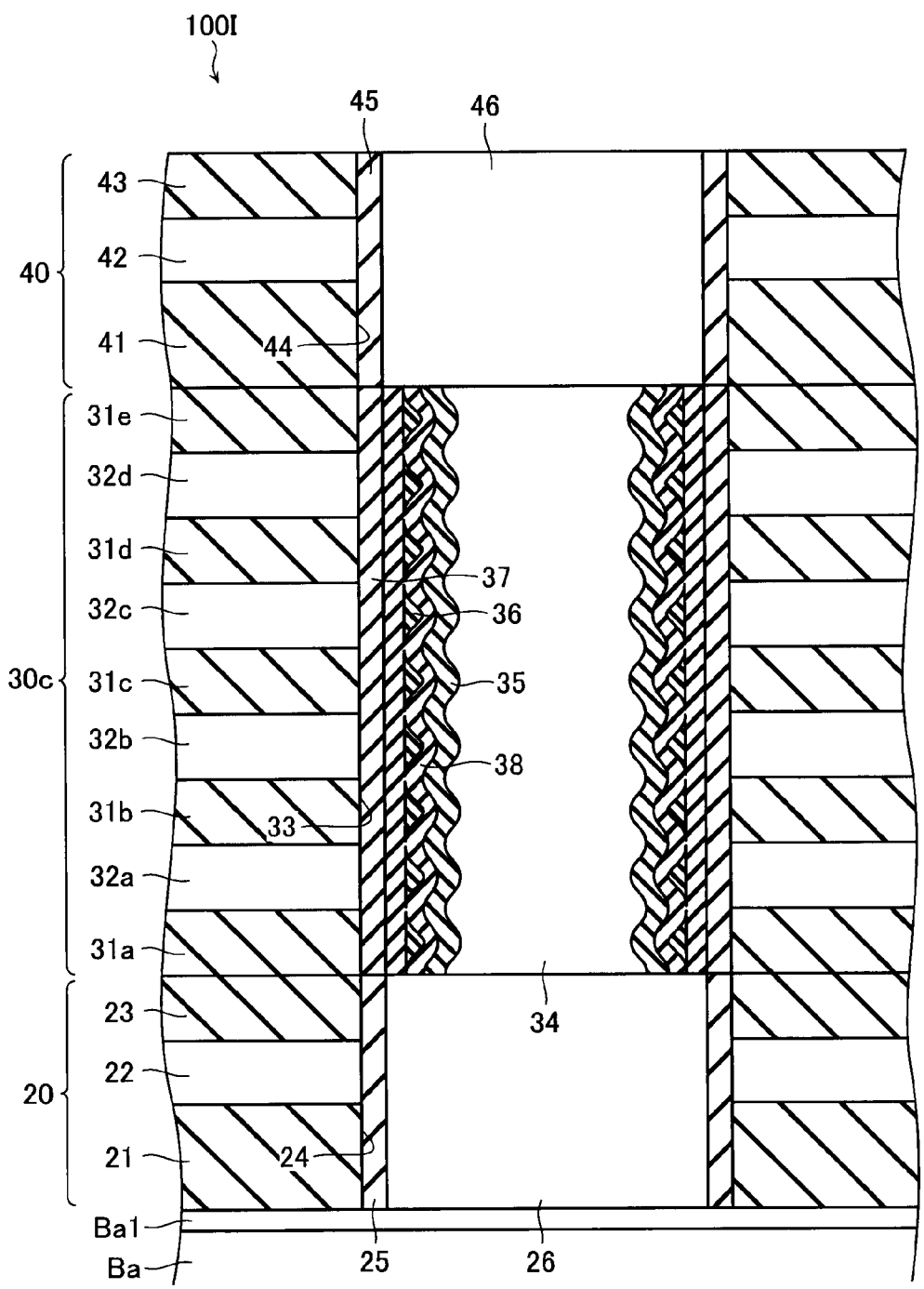
FIG. 16 is a cross-sectional view of a nonvolatile semiconductor memory device 100I in accordance with a tenth embodiment.

Configuration of a Nonvolatile Semiconductor Memory Device 100I in Accordance with a Tenth Embodiment Next, a configuration of a nonvolatile semiconductor memory device 100I in accordance with a tenth embodiment is described with reference to FIG. 16. FIG. 16 is a schematic cross-sectional view of the nonvolatile semiconductor memory device 100I in accordance with the tenth embodiment. Note that in the tenth embodiment, identical symbols are assigned to configurations similar to those in the first through ninth embodiments and descriptions thereof are omitted.

As shown in FIG. 16, the nonvolatile semiconductor memory device 100I in accordance with the tenth embodiment includes a memory transistor layer 30c which differs from those of the seventh through ninth embodiments.

The memory transistor layer 30c further includes a charge storage layer 38 in addition to configurations in accordance with the seventh embodiment. The charge storage layer 38 is formed so as to surround the charge storage layers 36. An energy level for storing an electron in the charge storage layer 38 is shallower than an energy level for storing an electron in the charge storage layers 36. A thickness of the charge storage layer 38 is 2 nm or more.

(Manufacturing Processes of the Nonvolatile Semiconductor Memory Device 100I in Accordance with the Tenth Embodiment)

Next, manufacturing processes of the nonvolatile semiconductor memory device 100I in accordance with the tenth embodiment are described with reference to FIGS. 17-20. FIGS. 17-20 are cross-sectional views showing a manufacturing process of the nonvolatile semiconductor memory device 100I in accordance with the tenth embodiment.

Figure 17:
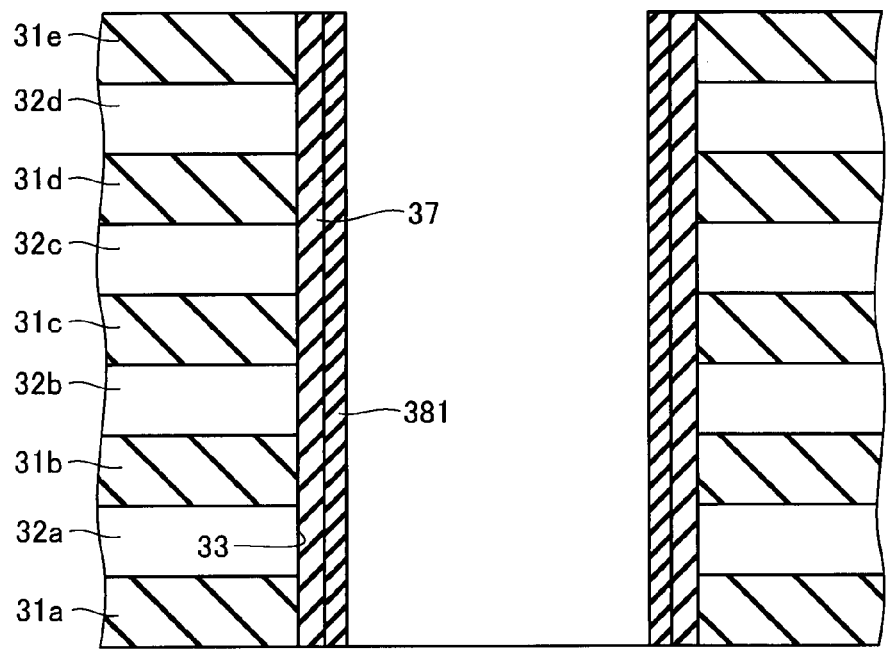
FIG. 17 is a cross-sectional view showing a manufacturing process of the nonvolatile semiconductor memory device 100I in accordance with the tenth embodiment.

First, aforementioned processes are executed up to and including those shown in FIG. 11. Next, as shown in FIG. 17, silicon oxide ($SiO_2$) and silicon nitride (SiN) are sequentially deposited on a side surface of the memory hole 33 to form the block insulating layer 37 and a layer 381. The layer 381 is a part of a layer that later becomes the charge storage layer 38.

Figure 18:
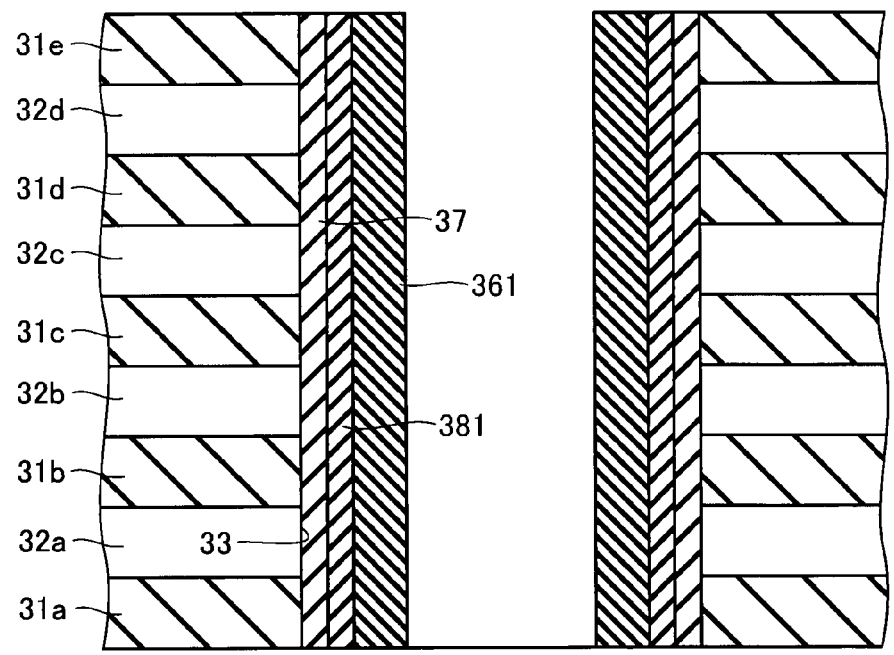
FIG. 18 is a cross-sectional view showing a manufacturing process of the nonvolatile semiconductor memory device 100I in accordance with the tenth embodiment.

Then, as shown in FIG. 18, hafnium (Hf) is further deposited on a side surface of the layer 381 to form the layer 361. The layer 361 is a layer that later becomes the charge storage layers 36.

Figure 19:
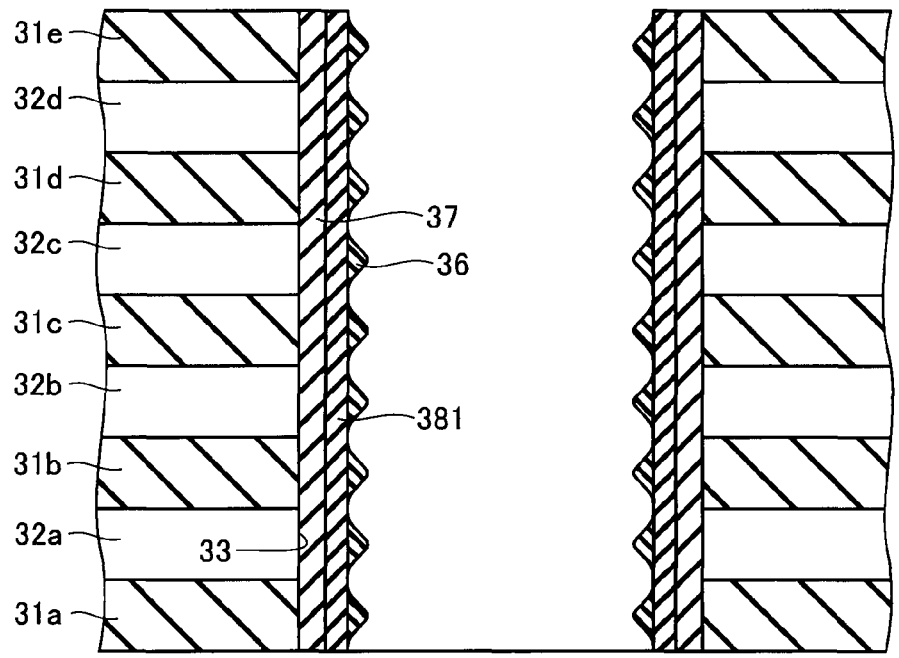
FIG. 19 is a cross-sectional view showing a manufacturing process of the nonvolatile semiconductor memory device 100I in accordance with the tenth embodiment.

Next, as shown in FIG. 19, a heat treatment (annealing) is applied to condense the layer 361, thereby dividing (discretizing) the layer 361 into a plurality thereof. Through this process, the layer 361 becomes the charge storage layers 36.

Figure 20:
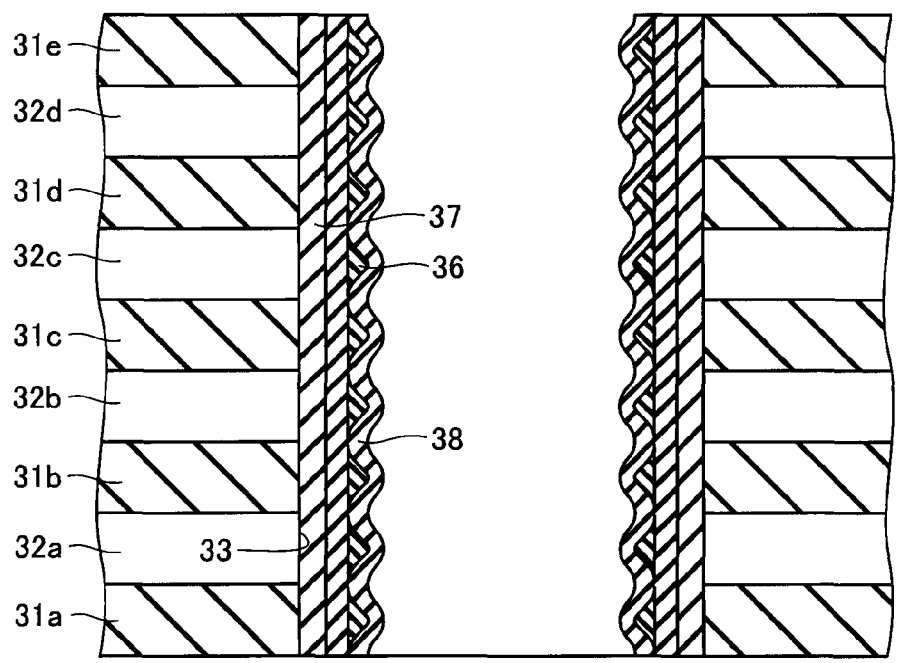
FIG. 20 is a cross-sectional view showing a manufacturing process of the nonvolatile semiconductor memory device 100I in accordance with the tenth embodiment.

Subsequently, as shown in FIG. 20, silicon nitride (SiN) is deposited on a surface of the charge storage layers 36 and on a side surface of the layer 381. Through this process, the charge storage layer 38 is formed so as to cover the charge storage layers 36.

Following FIG. 20, silicon oxide ($SiO_2$) is deposited on a surface of the charge storage layer 38 to form the tunnel insulating layer 35. Next, polysilicon (p-Si) is deposited in contact with the tunnel insulating layer 35 so as to fill the memory hole 33, thereby forming the memory columnar semiconductor layer 34. Then, the drain-side select transistor layer 40 is formed, thereby forming the nonvolatile semiconductor memory device 100I in accordance with the tenth embodiment shown in FIG. 16.

(Advantages of the Nonvolatile Semiconductor Memory Device 100I in Accordance with the Tenth Embodiment)

Next, advantages of the nonvolatile semiconductor memory device 100I in accordance with the tenth embodiment are described below. The nonvolatile semiconductor memory device 100I in accordance with the tenth embodiment includes the charge storage layer 38 having a similar configuration to that of the fourth embodiment. Consequently, the nonvolatile semiconductor memory device 100I in accordance with the tenth embodiment displays similar advantages to those of the fourth embodiment in addition to the advantages of the seventh embodiment.

Eleventh Embodiment

Figure 21:
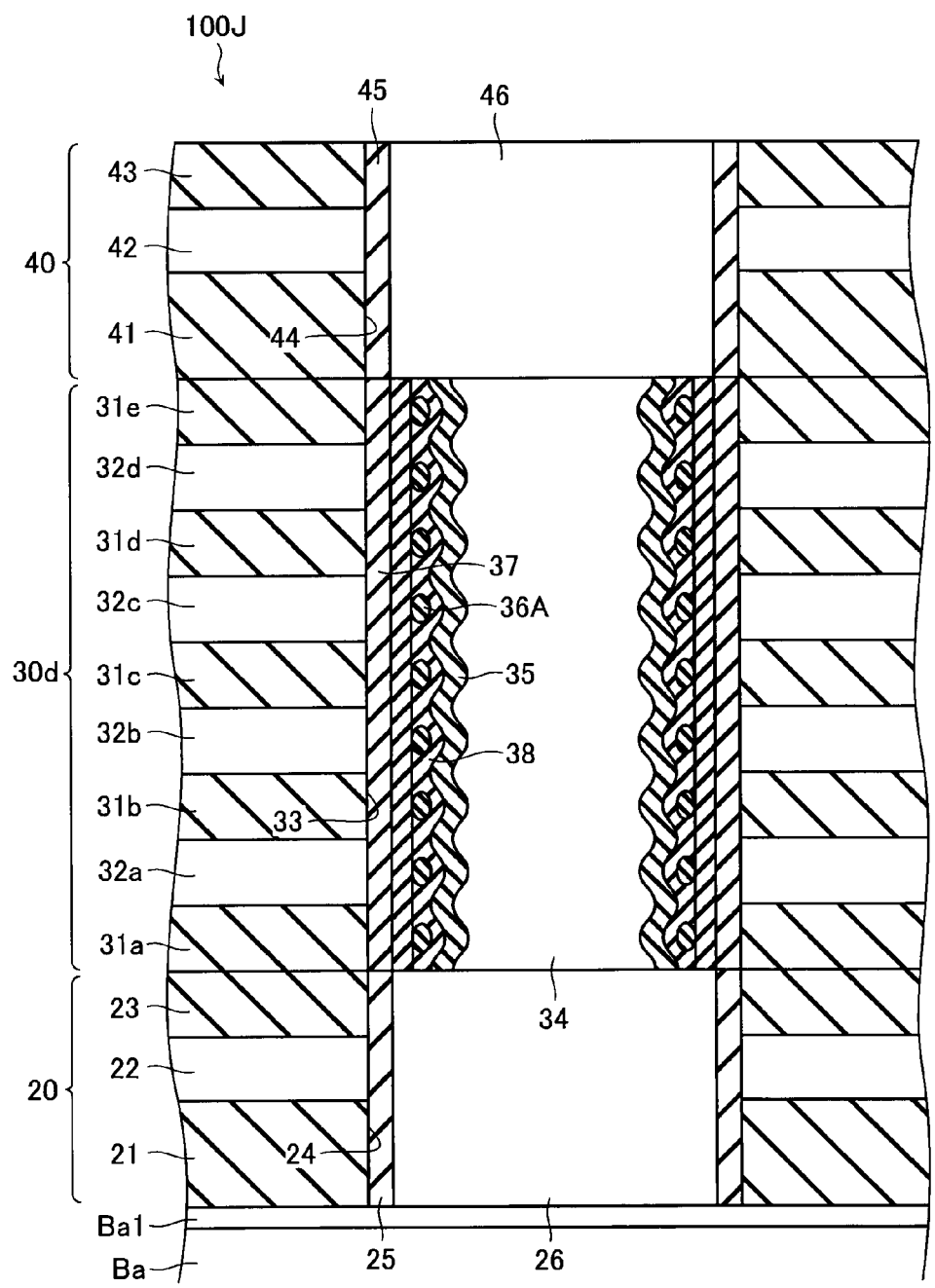
FIG. 21 is a cross-sectional view of a nonvolatile semiconductor memory device 100J in accordance with an eleventh embodiment.

Next, a configuration of a nonvolatile semiconductor memory device 100J in accordance with an eleventh embodiment is described with reference to FIG. 21. FIG. 21 is a schematic cross-sectional view of the nonvolatile semiconductor memory device 100J in accordance with the eleventh embodiment. Note that in the eleventh embodiment, identical symbols are assigned to configurations similar to those in the first through tenth embodiments and descriptions thereof are omitted.

As shown in FIG. 21, the nonvolatile semiconductor memory device 100J in accordance with the eleventh embodiment includes a memory transistor layer 30d which differs from those of the seventh through tenth embodiments.

The memory transistor layer 30d includes the charge storage layers 36A in place of the charge storage layers 36 in accordance with the tenth embodiment. The nonvolatile semiconductor memory device 100J in accordance with the eleventh embodiment displays similar advantages to those of the second and tenth embodiment.

Twelfth Embodiment

Figure 22:
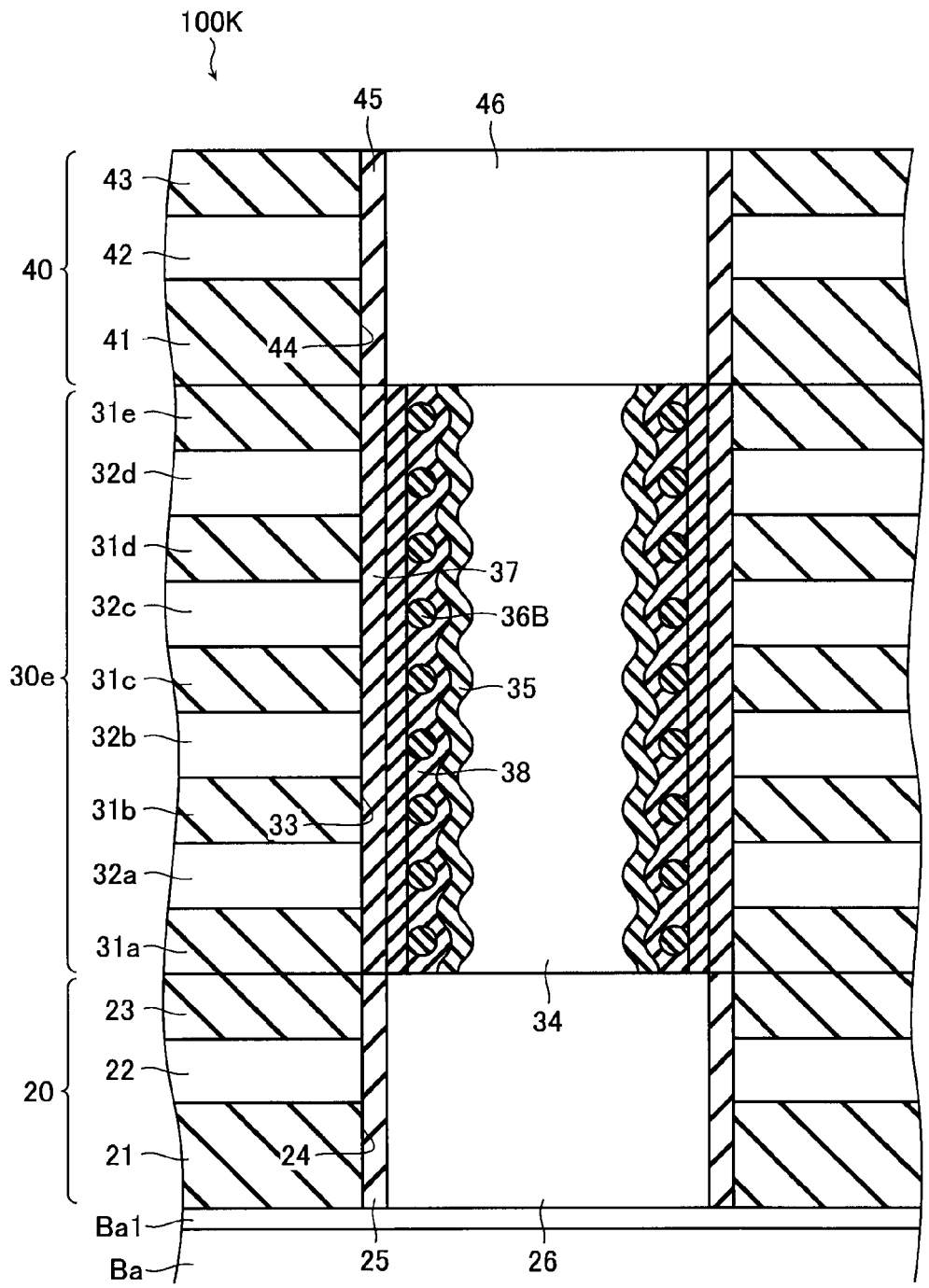
FIG. 22 is a cross-sectional view of a nonvolatile semiconductor memory device 100K in accordance with a twelfth embodiment.

Next, a configuration of a nonvolatile semiconductor memory device 100K in accordance with a twelfth embodiment is described with reference to FIG. 22. FIG. 22 is a schematic cross-sectional view of the nonvolatile semiconductor memory device 100K in accordance with the twelfth embodiment. Note that in the twelfth embodiment, identical symbols are assigned to configurations similar to those in the first through eleventh embodiments and descriptions thereof are omitted.

As shown in FIG. 22, the nonvolatile semiconductor memory device 100K in accordance with the twelfth embodiment includes a memory transistor layer 30e which differs from those of the seventh through eleventh embodiments.

The memory transistor layer 30e includes the charge storage layers 36B in place of the charge storage layers 36 and 36A in accordance with the tenth and eleventh embodiments. The nonvolatile semiconductor memory device 100K in accordance with the twelfth embodiment displays similar advantages to those of the third and tenth embodiments.

Thirteenth Embodiment

Figure 23:
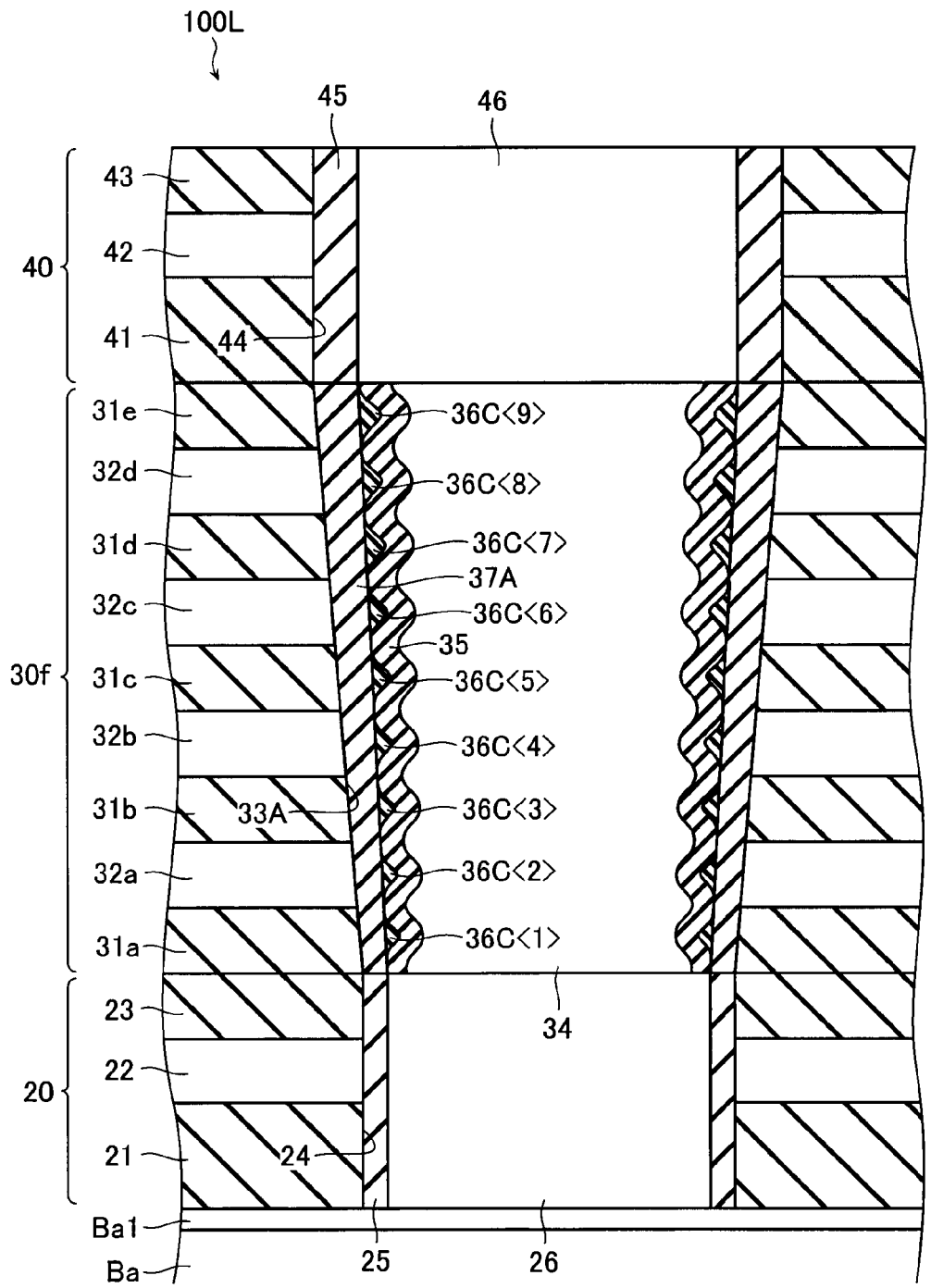
FIG. 23 is a cross-sectional view of a nonvolatile semiconductor memory device 100L in accordance with a thirteenth embodiment.

Next, a configuration of a nonvolatile semiconductor memory device 100L in accordance with a thirteenth embodiment is described with reference to FIG. 23. FIG. 23 is a schematic cross-sectional view of the nonvolatile semiconductor memory device 100L in accordance with the thirteenth embodiment. Note that in the thirteenth embodiment, identical symbols are assigned to configurations similar to those in the first through twelfth embodiments and descriptions thereof are omitted.

As shown in FIG. 23, the nonvolatile semiconductor memory device 100L in accordance with the thirteenth embodiment includes a memory transistor layer 30f which differs from those of the seventh through twelfth embodiments.

The memory transistor layer 30f includes a memory hole 33A, a plurality of charge storage layers 36C<1>-36C<9>, and a block insulating layer 37A which differ from those of the seventh through twelfth embodiments.

The memory hole 33A is formed in a tapered shape having a diameter that becomes smaller from an upper layer to a lower layer.

The charge storage layers 36C<1>-36C<9> are formed in isolation from one another. The charge storage layers 36C<1>-36C<9> are formed such that an occupied volume thereof increases from a lower layer to an upper layer. The charge storage layers 36C<1>-36C<9> are formed in a mountain shape protruding towards the memory columnar semiconductor layer 34.

The block insulating layer 37A is formed so as to become thicker from a lower layer to an upper layer.

(Advantages of the Nonvolatile Semiconductor Memory Device 100L in Accordance with the Thirteenth Embodiment)

Next, advantages of the nonvolatile semiconductor memory device 100L in accordance with the thirteenth embodiment are described using a comparative example. The comparative example has a configuration substantially similar to that of the nonvolatile semiconductor memory device 100L in accordance with the thirteenth embodiment. The comparative example differs from the thirteenth embodiment in including the charge storage layers 36 and the block insulating layer 37 in accordance with the seventh embodiment. That is to say, the charge storage layers 36 have a same occupied volume from a lower layer to an upper layer; and the block insulating layer 37 has an identical thickness from a lower layer to an upper layer.

In the nonvolatile semiconductor memory device 100L in accordance with the thirteenth embodiment and in the comparative example, the memory hole 33A is formed in a tapered shape, and consequently an electric field generated at a lower layer of the memory hole 33A is larger than an electric field generated at an upper layer of the memory hole 33A.

In the comparative example, the charge storage layers 36 and the block insulating layer 37 enable write/erase to be executed more easily here for memory transistors configured by lower layer charge storage layers 36. That is to say, a write/erase characteristic of the memory transistors is non-uniform from the upper layer to the lower layer of the memory hole 33A.

In contrast, the nonvolatile semiconductor memory device 100L in accordance with the thirteenth embodiment includes the charge storage layers 36C<1>-36C<9> and the block insulating layer 37A. As a result, a write/erase characteristic of the memory transistors in the nonvolatile semiconductor memory device 100L can be made uniform from the upper layer to the lower layer. Note that the nonvolatile semiconductor memory device 100L in accordance with the thirteenth embodiment displays similar advantages to those of the seventh embodiment.

Fourteenth Embodiment

Figure 24:
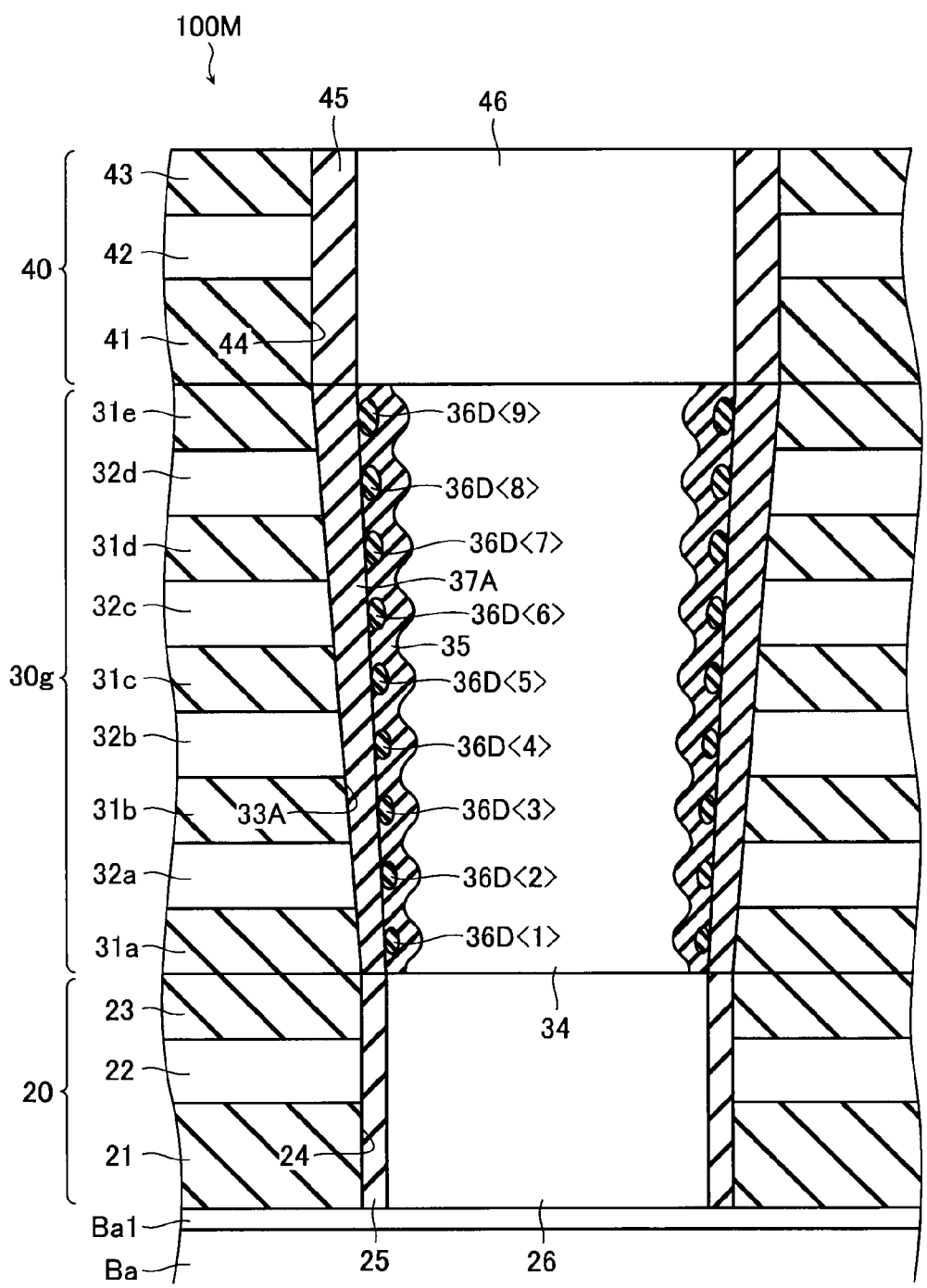
FIG. 24 is a cross-sectional view of a nonvolatile semiconductor memory device 100M in accordance with a fourteenth embodiment.

Next, a configuration of a nonvolatile semiconductor memory device 100M in accordance with a fourteenth embodiment is described with reference to FIG. 24. FIG. 24 is a schematic cross-sectional view of the nonvolatile semiconductor memory device 100M in accordance with the fourteenth embodiment. Note that in the fourteenth embodiment, identical symbols are assigned to configurations similar to those in the first through thirteenth embodiments and descriptions thereof are omitted.

As shown in FIG. 24, the nonvolatile semiconductor memory device 100M in accordance with the fourteenth embodiment includes a memory transistor layer 30g which differs from those of the seventh through thirteenth embodiments.

The memory transistor layer 30g includes the memory hole 33A, the block insulating layer 37A, and a plurality of charge storage layers 36D<1>-36D<9> which differ from those of the seventh through thirteenth embodiments. The charge storage layers 36D<1>-36D<9> are formed in isolation from one another. The charge storage layers 36D<1>-36D<9> are formed such that an occupied volume thereof increases from a lower layer to an upper layer. The charge storage layers 36D<1>-36D<9> are formed in an elliptical shape. The nonvolatile semiconductor memory device 100M in accordance with the fourteenth embodiment displays similar advantages to those of the second and thirteenth embodiment.

Fifteenth Embodiment

Figure 25:
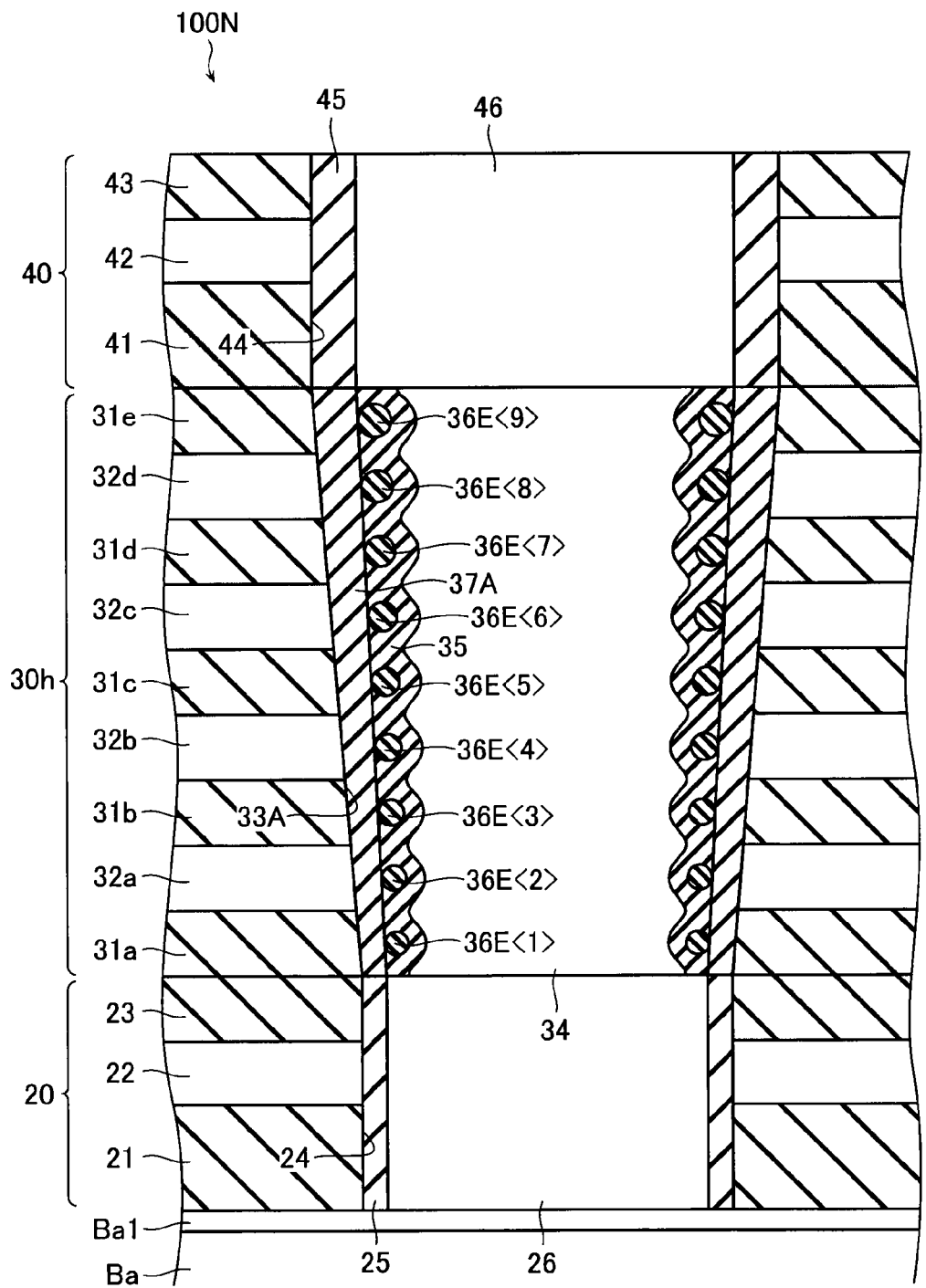
FIG. 25 is a cross-sectional view of a nonvolatile semiconductor memory device 100N in accordance with a fifteenth embodiment.

Next, a configuration of a nonvolatile semiconductor memory device 100N in accordance with a fifteenth embodiment is described with reference to FIG. 25. FIG. 25 is a schematic cross-sectional view of the nonvolatile semiconductor memory device 100N in accordance with the fifteenth embodiment. Note that in the fifteenth embodiment, identical symbols are assigned to configurations similar to those in the first through fourteenth embodiments and descriptions thereof are omitted.

As shown in FIG. 25, the nonvolatile semiconductor memory device 100N in accordance with the fifteenth embodiment includes a memory transistor layer 30h which differs from those of the seventh through fourteenth embodiments.

The memory transistor layer 30h includes the memory hole 33A, the block insulating layer 37A, and a plurality of charge storage layers 36E<1>-36E<9> which differ from those of the seventh through fourteenth embodiments. The charge storage layers 36E<1>-36E<9> are formed in isolation from one another. The charge storage layers 36E<1>-36E<9> are formed such that an occupied volume thereof increases from a lower layer to an upper layer. The charge storage layers 36E<1>-36E<9> are formed in a spherical shape. The nonvolatile semiconductor memory device 100N in accordance with the fifteenth embodiment displays similar advantages to those of the third and thirteenth embodiments.

Sixteenth Embodiment

Figure 26:
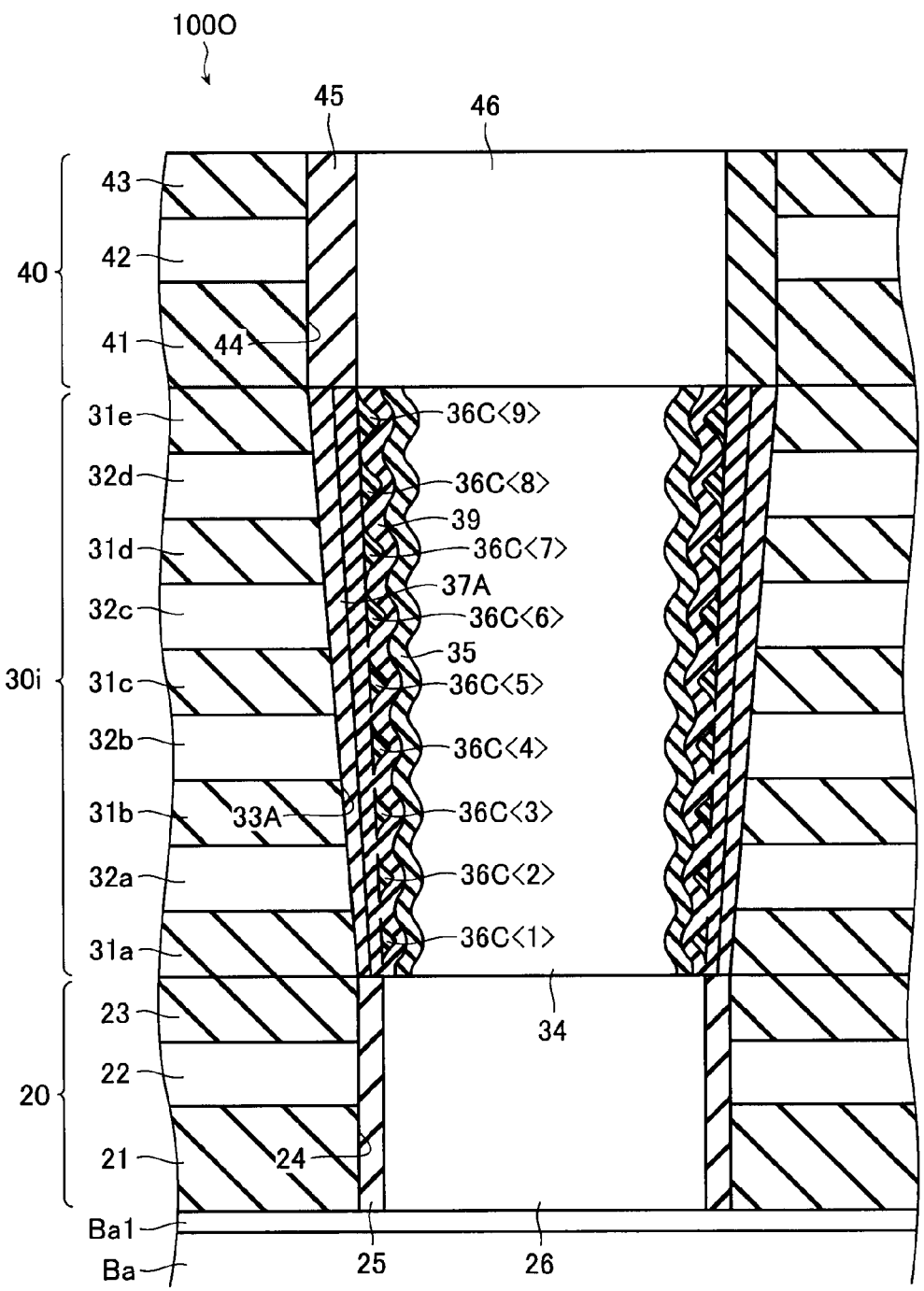
FIG. 26 is a cross-sectional view of a nonvolatile semiconductor memory device 100O in accordance with a sixteenth embodiment.

Next, a configuration of a nonvolatile semiconductor memory device 100O in accordance with a sixteenth embodiment is described with reference to FIG. 26. FIG. 26 is a schematic cross-sectional view of the nonvolatile semiconductor memory device 100O in accordance with the sixteenth embodiment. Note that in the sixteenth embodiment, identical symbols are assigned to configurations similar to those in the first through fifteenth embodiments and descriptions thereof are omitted.

As shown in FIG. 26, the nonvolatile semiconductor memory device 100O in accordance with the sixteenth embodiment includes a memory transistor layer 30$i$ which differs from those of the seventh through fifteenth embodiments.

The memory transistor layer 30$i$ further includes a charge storage layer 39 in addition to configurations in accordance with the thirteenth embodiment. The charge storage layer 39 is formed so as to surround the charge storage layers 36C<1>-36C<9>. An energy level for storing an electron in the charge storage layer 39 is shallower than an energy level for storing an electron in the charge storage layers 36C<1>-36C<9>.

(Advantages of the Nonvolatile Semiconductor Memory Device 100O in Accordance with the Sixteenth Embodiment)

Next, advantages of the nonvolatile semiconductor memory device 100O in accordance with the sixteenth embodiment are described below. The nonvolatile semiconductor memory device 100O in accordance with the sixteenth embodiment is configured as described above and thus displays similar advantages to those of the tenth and the thirteenth embodiment.

Seventeenth Embodiment

Figure 27:
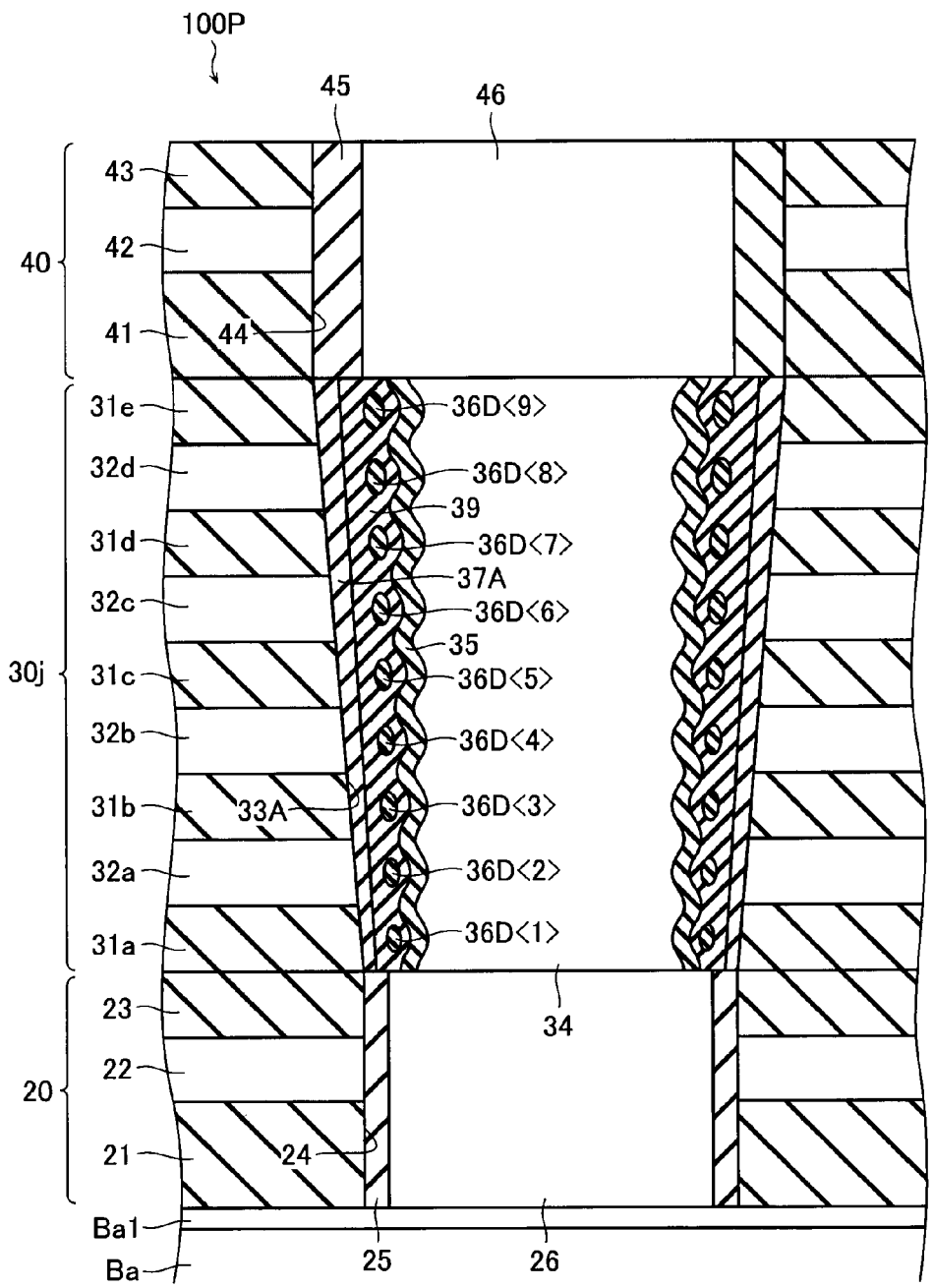
FIG. 27 is a cross-sectional view of a nonvolatile semiconductor memory device 100P in accordance with a seventeenth embodiment.

Next, a configuration of a nonvolatile semiconductor memory device 100P in accordance with a seventeenth embodiment is described with reference to FIG. 27. FIG. 27 is a schematic cross-sectional view of the nonvolatile semiconductor memory device 100P in accordance with the seventeenth embodiment. Note that in the seventeenth embodiment, identical symbols are assigned to configurations similar to those in the first through sixteenth embodiments and descriptions thereof are omitted.

As shown in FIG. 27, the nonvolatile semiconductor memory device 100P in accordance with the seventeenth embodiment includes a memory transistor layer 30$j$ which differs from those of the seventh through sixteenth embodiments.

The memory transistor layer 30$j$ includes the charge storage layers 36D<1>-36D<9> in place of the charge storage layers 36C<1>-36C<9> in accordance with the sixteenth embodiment. The nonvolatile semiconductor memory device 100P in accordance with the seventeenth embodiment displays similar advantages to those of the second and sixteenth embodiment.

Eighteenth Embodiment

Figure 28:
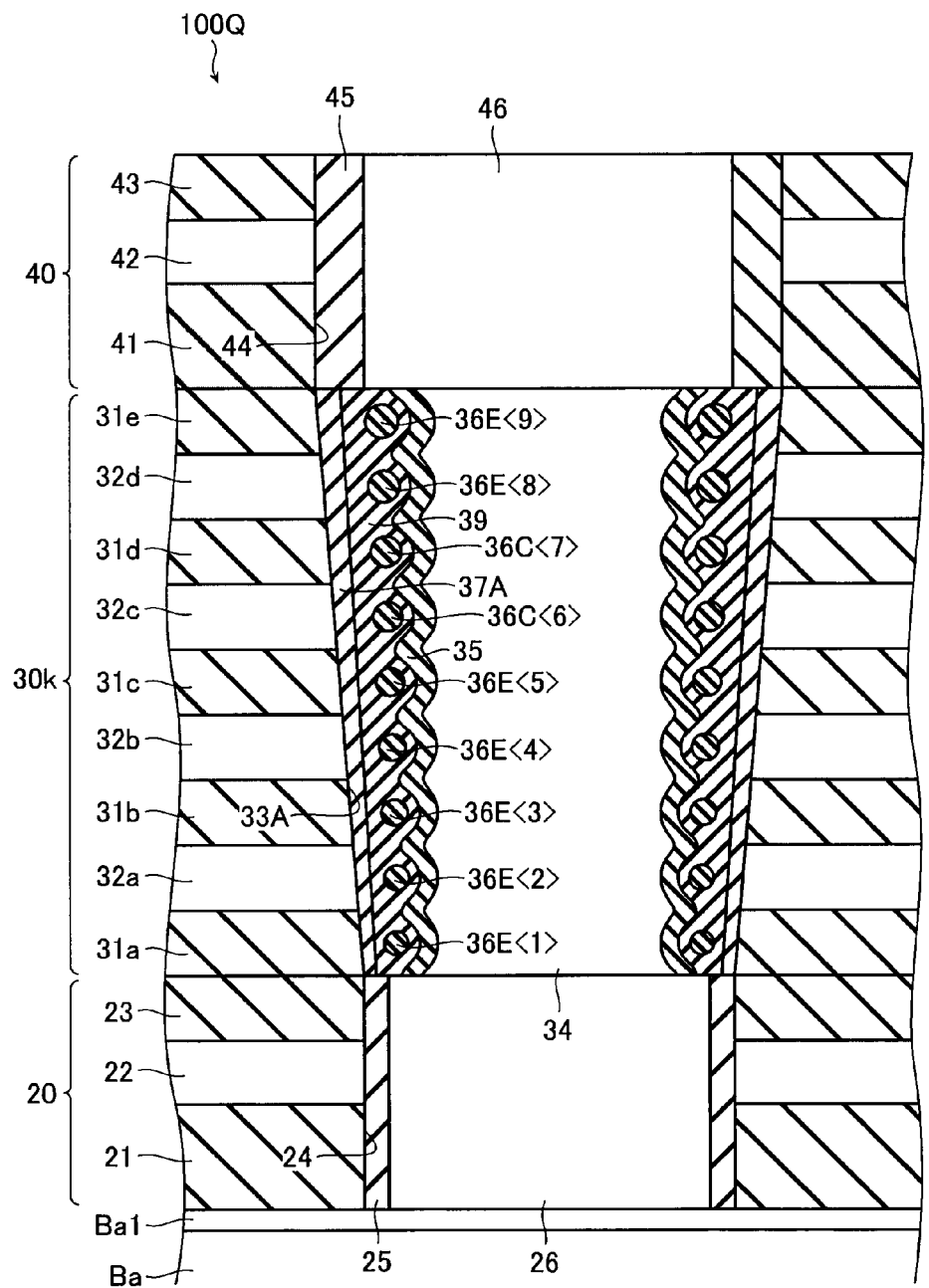
FIG. 28 is a cross-sectional view of a nonvolatile semiconductor memory device 100Q in accordance with a eighteenth embodiment.

Next, a configuration of a nonvolatile semiconductor memory device 100Q in accordance with an eighteenth embodiment is described with reference to FIG. 28. FIG. 28 is a schematic cross-sectional view of the nonvolatile semiconductor memory device 100Q in accordance with the eighteenth embodiment. Note that in the eighteenth embodiment, identical symbols are assigned to configurations similar to those in the first through seventeenth embodiments and descriptions thereof are omitted.

As shown in FIG. 28, the nonvolatile semiconductor memory device 100Q in accordance with the eighteenth embodiment includes a memory transistor layer 30$k$ which differs from those of the seventh through seventeenth embodiments.

The memory transistor layer 30$k$ includes the charge storage layers 36E<1>-36E<9> in place of the charge storage layers 36C<1>-36C<9> and 36D<1>-36D<9> in accordance with the sixteenth and seventeenth embodiments. The nonvolatile semiconductor memory device 100Q in accordance with the eighteenth embodiment displays similar advantages to those of the third and sixteenth embodiments.

Nineteenth Embodiment

Figure 29:
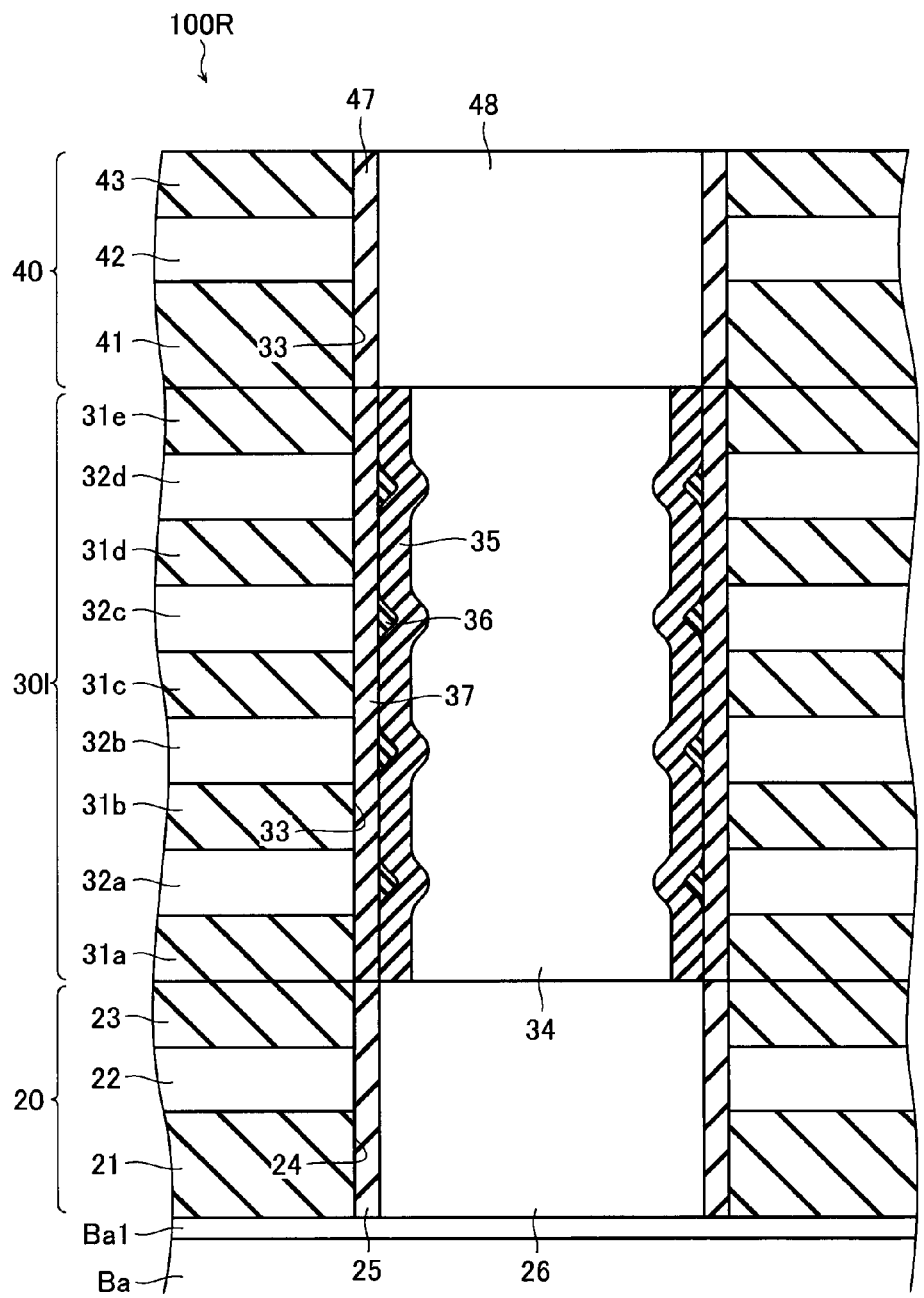
FIG. 29 is a cross-sectional view of a nonvolatile semiconductor memory device 100R in accordance with a nineteenth embodiment.

Next, a configuration of a nonvolatile semiconductor memory device 100R in accordance with a nineteenth embodiment is described with reference to FIG. 29. FIG. 29 is a schematic cross-sectional view of the nonvolatile semiconductor memory device 100R in accordance with the nineteenth embodiment. Note that in the nineteenth embodiment, identical symbols are assigned to configurations similar to those in the first through eighteenth embodiments and descriptions thereof are omitted.

As shown in FIG. 29, the nonvolatile semiconductor memory device 100R in accordance with the nineteenth embodiment includes a memory transistor layer 30$l$ which differs from those of the seventh through eighteenth embodiments.

The memory transistor layer 30$l$ is similar to that of the seventh embodiment except for a configuration of the charge storage layers 36. In the memory transistor layer 30$l$, the charge storage layers 36 are formed only at a position of the first through fourth word line conductive layers 32$a$-32$d$ in the stacking direction. That is to say, the charge storage layers 36 are not formed at a position of the first through fifth inter-word line insulating layers 31$a$-31$e$ in the stacking direction.

(Manufacturing Processes of the Nonvolatile Semiconductor Memory Device 100R in Accordance with the Nineteenth Embodiment)

Next, manufacturing processes of the nonvolatile semiconductor memory device 100R in accordance with the nineteenth embodiment are described with reference to FIGS. 30-33. FIGS. 30-33 are cross-sectional views showing a manufacturing process of the nonvolatile semiconductor memory device 100R in accordance with the nineteenth embodiment.

Figure 30:
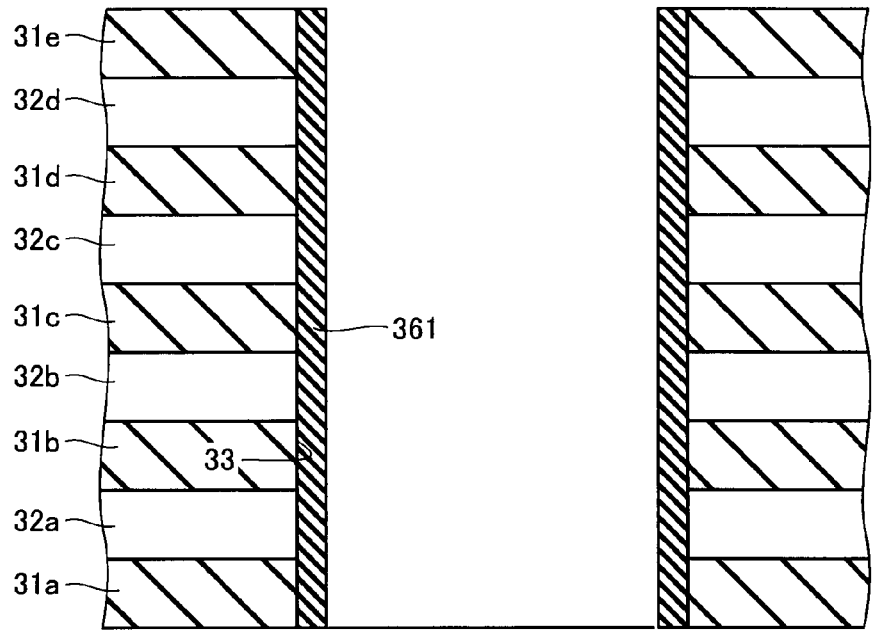
FIG. 30 is a cross-sectional view showing a manufacturing process of the nonvolatile semiconductor memory device 100R in accordance with the nineteenth embodiment.

First, processes are executed up to and including those shown in FIG. 11 of the seventh embodiment. Then, as shown in FIG. 30, hafnium (Hf) is deposited on a side surface of the memory hole 33 to form the layer 361. The layer 361 is a layer that later becomes the charge storage layers 36.

Figure 31:
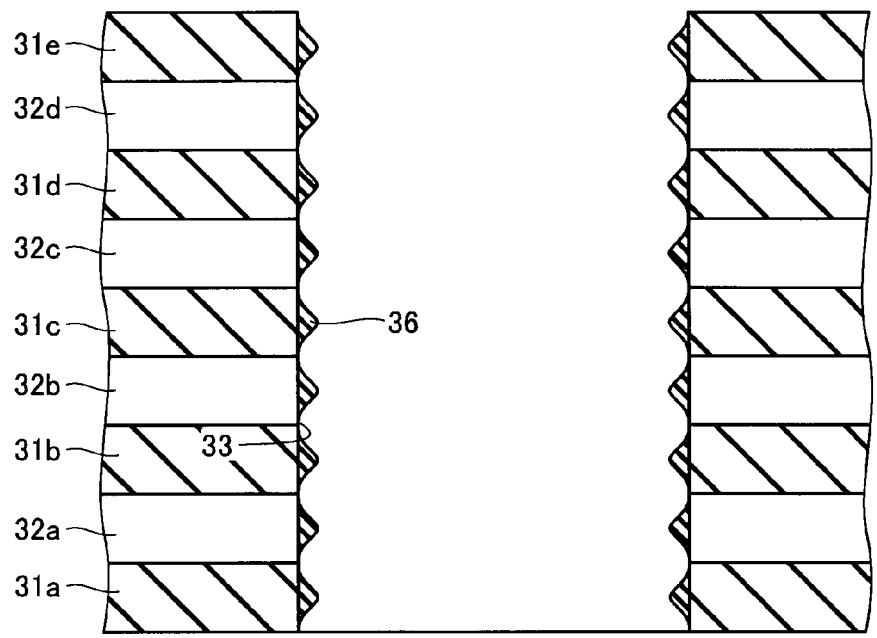
FIG. 31 is a cross-sectional view showing a manufacturing process of the nonvolatile semiconductor memory device 100R in accordance with the nineteenth embodiment.

Next, as shown in FIG. 31, a heat treatment (annealing) is applied to condense the layer 361, thereby dividing (discretizing) the layer 361 into a plurality thereof. Through this process, the layer 361 becomes the charge storage layers 36.

Figure 32:
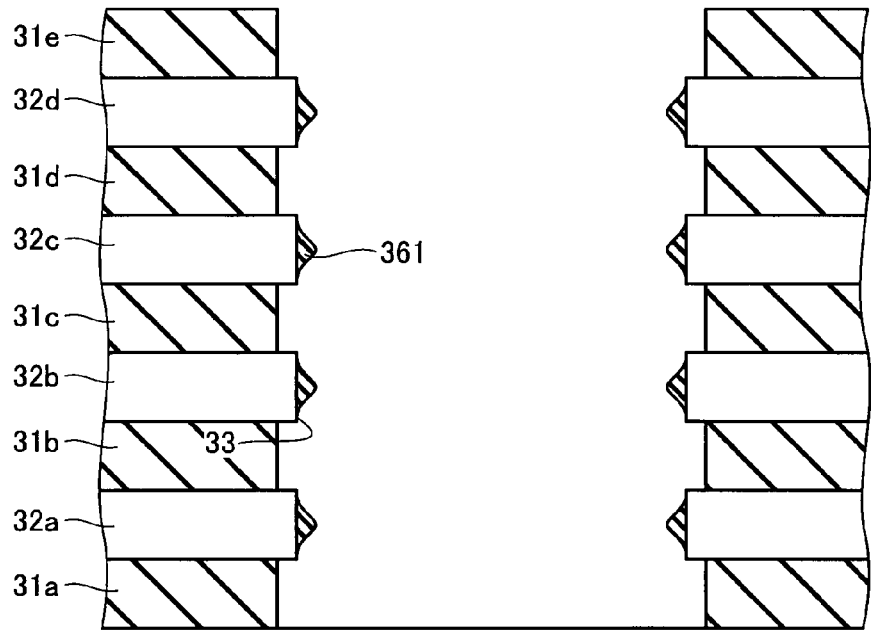
FIG. 32 is a cross-sectional view showing a manufacturing process of the nonvolatile semiconductor memory device 100R in accordance with the nineteenth embodiment.

Subsequently, as shown in FIG. 32, wet etching is used to selectively etch back a side surface of the first through fifth inter-word line insulating layers 31$a$-31$e$. Through this process, the charge storage layers 36 positioned on the side surface of the first through fifth inter-word line insulating layers 31$a$-31$e$ are removed.

Figure 33:
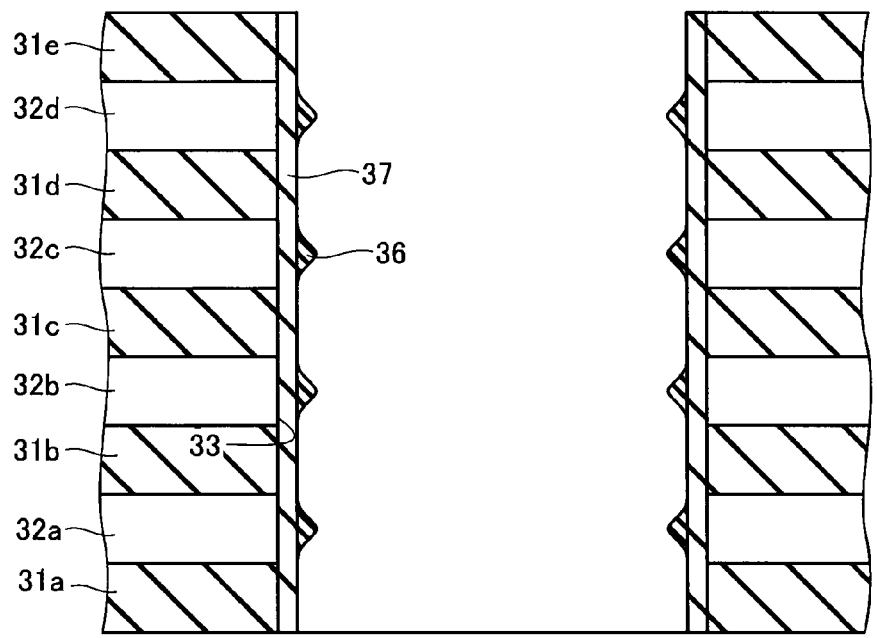
FIG. 33 is a cross-sectional view showing a manufacturing process of the nonvolatile semiconductor memory device 100R in accordance with the nineteenth embodiment.

Next, as shown in FIG. 33, a side surface of the first through fourth word line conductive layers 32$a$-32$d$ is oxidized to form the block insulating layer 37.

Following FIG. 33, silicon oxide ($SiO_2$) is deposited on a surface of the charge storage layers 36 to form the tunnel insulating layer 35. Next, polysilicon (p-Si) is deposited in contact with the tunnel insulating layer 35 so as to fill the memory hole 33, thereby forming the memory columnar semiconductor layer 34. Then, the drain-side select transistor layer 40 is formed, thereby forming the nonvolatile semiconductor memory device 100R in accordance with the nineteenth embodiment shown in FIG. 29.

(Advantages of the Nonvolatile Semiconductor Memory Device 100r in Accordance with the Nineteenth Embodiment)

Next, advantages of the nonvolatile semiconductor memory device 100R in accordance with the nineteenth embodiment are described below. In the nonvolatile semiconductor memory device 100R in accordance with the nineteenth embodiment, the charge storage layers 36 are not formed on the side surface of the first through fifth inter-word line insulating layers 31a-31e, as described above. Consequently, the nonvolatile semiconductor memory device 100R can suppress movement of charge between the memory transistors MTr1-MTr4 more than the first through eighteenth embodiments.

Other Embodiments

This concludes description of embodiments of the nonvolatile semiconductor memory device in accordance with the present invention, but it should be noted that the present invention is not limited to the above-described embodiments, and that various alterations, additions, substitutions, and so on, are possible within a range not departing from the scope and spirit of the invention. For example, the above-described configuration in accordance with the nineteenth embodiment can be applied also to the eighth through eighteenth embodiments.

For example, in the above-described first through nineteenth embodiments, the charge storage layers 13, 13A, 13B, 36, 36A, 36B, 36C<1>-36C<9>, 36D<1>-36D<9>, and 36E<1>-36E<9> are not limited to hafnium (Hf) and may be constituted by zirconium (Zr), tungsten (W), titanium (Ti), or silicon (Si).

For example, in the above-described first through nineteenth embodiments, the charge storage layers 13, 13A, 13B, 36, 36A, 36B, 36C<1>-36C<9>, 36D<1>-36D<9>, and 36E<1>-36E<9> may be constituted by other oxide or nitride. In this case, ozone should be circulated during formation of the layer 361; and annealing of the layer 361 should be carried out in an oxygen gas atmosphere, an ammonia gas atmosphere, or the like.

For example, in the above-described first through nineteenth embodiments, the block insulating layer 14 and 37 may be constituted by alumina ($Al_2O_3$). In this case, the block insulating layer 14 and 37 is formed by executing MOCVD in a temperature band of 500° C.-800° C., or ALD in a temperature band of 200° C.-400° C., with trimethylaluminum and ozone (or water vapor) as raw materials.

For example, the nonvolatile semiconductor memory devices 100L-100Q in accordance with the thirteenth through eighteenth embodiments include the plurality of charge storage layers 36C<1>-36C<9>, 36D<1>-36D<9>, and 36E<1>-36E<9> formed such that an occupied volume thereof increases from a lower layer to an upper layer. However, the present invention is not limited to the above-described configuration, and a configuration that includes a plurality of charge storage layers formed such that a surface density thereof increases from a lower layer to an upper layer is also possible.

For example, in the above-described first through nineteenth embodiments, the tunnel insulating layer 12 and 35 may have a stacking structure of silicon oxide film/silicon nitride film/silicon oxide film.

What is claimed is:

1. A nonvolatile semiconductor memory device, comprising:
a memory string which has a plurality of electrically rewritable memory cells connected in series,
the memory string comprising:
a semiconductor layer extending in a perpendicular direction with respect to a substrate;
a conductive layer which is formed so as to surround a side surface of the semiconductor layer with a first insulating layer and a second insulating layer interposed therebetween and is configured to function as a control electrode of the memory cells; and
a plurality of first charge storage layers formed between the first insulating layer and the second insulating layer,
the plurality of first charge storage layers being formed in isolation from one another along a surface of the first insulating layer, and
the first insulating layer being formed so as to protrude towards the semiconductor layer at a position where each of the first charge storage layers is formed.

2. The nonvolatile semiconductor memory device according to claim 1, further comprising:
a second charge storage layer formed so as to surround the first charge storage layers,
wherein an energy level for storing an electron in the second charge storage layer is shallower than an energy level for storing an electron in the first charge storage layers.

3. The nonvolatile semiconductor memory device according to claim 1,
wherein the semiconductor layer is formed in a tapered shape having a diameter that becomes smaller from an upper layer to a lower layer, and
wherein the first charge storage layers are configured such that an occupied volume thereof decreases from an upper layer to a lower layer.

4. The nonvolatile semiconductor memory device according to claim 1,
wherein the semiconductor layer is formed in a tapered shape having a diameter that becomes smaller from an upper layer to a lower layer, and
wherein the first charge storage layers are configured such that a surface density thereof decreases from an upper layer to a lower layer.

5. The nonvolatile semiconductor memory device according to claim 1,
wherein the first charge storage layers are formed only at a position of the conductive layer in a stacking direction.

6. The nonvolatile semiconductor memory device according to claim 1,
wherein the first charge storage layers are formed in a mountain shape protruding towards the semiconductor layer.

7. The nonvolatile semiconductor memory device according to claim 1,
wherein the first charge storage layers are formed in an elliptical shape.

8. The nonvolatile semiconductor memory device according to claim 1,
wherein the first charge storage layers are formed in a spherical shape.

* * * * *